United States Patent [19]

Turner et al.

[11] Patent Number: 4,756,815

[45] Date of Patent: Jul. 12, 1988

[54] WAFER COATING SYSTEM

[75] Inventors: Frederick T. Turner, Sunnyvale; Martin A. Hutchinson, Santa Clara; R. Howard Shaw, Palo Alto; Lawrence T. Lamont, Jr., Mountain View, all of Calif.

[73] Assignee: Varian Associates, Inc., Palo Alto, Calif.

[21] Appl. No.: 106,343

[22] Filed: Dec. 21, 1979

[51] Int. Cl.$^4$ .................. C23C 14/36; C23C 14/50
[52] U.S. Cl. ................... 204/298; 204/192.12
[58] Field of Search ............ 204/192 R, 298; 118/724, 725, 728, 729, 730, 500, 503; 269/254 R, 903; 414/217, 222, 225; 198/339, 394, 480, 803

[56] References Cited

U.S. PATENT DOCUMENTS

| | | | |
|---|---|---|---|
| 1,377,027 | 5/1921 | Pettit | 369/189 |
| 1,953,492 | 4/1934 | May | 141/65 |
| 2,337,329 | 12/1943 | Hewlett | 427/248.1 |
| 2,501,391 | 3/1950 | Karp | 369/195 |
| 2,864,332 | 12/1958 | Wooley | 118/722 |
| 2,865,643 | 12/1958 | Parker et al. | 279/106 |
| 3,159,395 | 12/1964 | Mussett et al. | 269/254 R |
| 3,340,176 | 9/1967 | Belluso et al. | 204/298 |
| 3,521,765 | 7/1970 | Kauffman et al. | 414/217 |
| 3,566,960 | 3/1971 | Stuart | 165/107 |
| 3,598,083 | 8/1971 | Dort et al. | 118/730 |
| 3,625,384 | 12/1971 | Boerger et al. | 414/413 |
| 3,652,444 | 3/1972 | Lester et al. | 204/298 |
| 3,721,210 | 3/1973 | Helms et al. | 118/48 |
| 3,838,028 | 9/1974 | Needham et al. | 204/298 |
| 3,856,654 | 12/1974 | George | 204/298 |
| 3,874,525 | 4/1975 | Hassan et al. | 414/225 |
| 3,915,117 | 10/1975 | Schertler | 118/719 |
| 3,921,572 | 11/1975 | Brunner et al. | 118/730 |
| 3,977,955 | 8/1976 | Nevis et al. | 204/192.32 |
| 3,981,791 | 9/1976 | Rosvold | 204/298 |
| 3,983,838 | 10/1976 | Christensen | 118/730 |
| 4,047,624 | 9/1977 | Dorenbos | 414/217 |
| 4,060,470 | 11/1977 | Clarke | 204/192 R |
| 4,068,814 | 1/1978 | Anthony et al. | 248/176 |
| 4,094,722 | 6/1978 | Yamamoto et al. | 156/345 |
| 4,228,358 | 10/1980 | Ryding | 250/492.2 |
| 4,261,762 | 4/1981 | King | 148/1.5 |
| 4,261,808 | 4/1981 | Walter | 204/298 |

FOREIGN PATENT DOCUMENTS 54-150333 11/1979 Japan .

OTHER PUBLICATIONS

Brunner, IBM Technical Disclosure Bulletin, vol. 17, No. 1, Jun. 1974.
"Thin Film Rotary Fixturing", Brochure of Varian Vacuum Div., (VAC 2426), 611 Hansen Way, Palo Alto, Calif. 94303-11/73.
R. L. Bailey et al., Electrical Probe Testing of Semiconductor Wafers, Western Electric Technical Digest, No. 44, pp. 3-4, Oct. 1976.
R. W. Berry et al., Thin Film Technology, Van Nostrand Reinhold Co., New York, 1968, pp. 204-205.

Primary Examiner—John F. Niebling
Assistant Examiner—William T. Leader
Attorney, Agent, or Firm—Stanley Z. Cole; Gerald M. Fisher; Terrence E. Dooher

[57] ABSTRACT

Semiconductor wafers having patterns of steps and grooves defining microcircuit elements thereon are coated with metallic film by supporting the wafers individually adjacent a respective ring-shaped sputtering source in stationary relationship thereto. Within a short deposition time of approximately one minute, good uniformity of deposition across the main wafer plane is obtained by maintaining source-to-wafer spacing less than the diameter of the source, and an effective source diameter ($D_s$) larger than the diameter of wafer ($D_w$) with the coating being performed within an argon environment of 2 to 20 microns pressure. Good step coverage across all surfaces of steps and grooves is likewise obtained, and is further enhanced by confining the source-to-wafer spacing ranges to certain values within about 0.4 $D_s$ to 0.9 $D_s$ and the wafer diameter to certain values up to about 0.7 $D_s$. To effectuate such individual wafer processing on a continuous basis and preserve the evacuated argon environment, a vacuum chamber sputter coating apparatus is provided which has a number of work stations therein, at least one of which includes said (Abstract continued on next page.)

ring-shaped sputtering source. Also included is a load lock; and an intermittently rotating vertical plate-like wafer carrier means therewithin positioned closely adjacent the chamber entrance, and carrying wafers in turn from the load lock to the work stations. The carrier includes apertures each accepting a wafer therewithin in an upright position, with the wafers edgewise resiliently supported by clip means, without the use of any externally-originating supports such as platens. A closure member within the chamber is movable against the plate opposite the chamber entrance to close off the plate aperture from the chamber environment during loading and unloading of a wafer, and a door is provided to close the chamber opening and thus complete a thin low-volume load lock. The door is also provided with vacuum means to grasp a wafer presented vertically by a blade-like elevator which cooperates with a cassette and conveyor moving the cassette along a horizontal path below the chamber entrance. The cassette holds wafers vertically, and the blade passes therethrough to lift individual wafers edgewise to the door vacuum means. Closure of the door inserts the wafer into the clip means within the carrier and chamber, and the reverse operation extracts a wafer previously coated at a sputtering work station. Both surfaces of the wafer can be accessed by processing equipment, for example, heating or cooling means at some of the work stations. Only a few wafers inside the chamber are at risk at any one time, and introduction of contaminants, debris, as well as disturbances to the chamber environment are minimized.

22 Claims, 9 Drawing Sheets

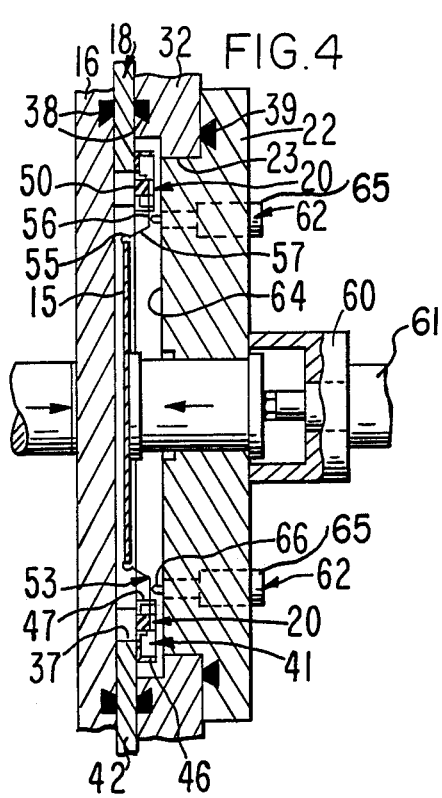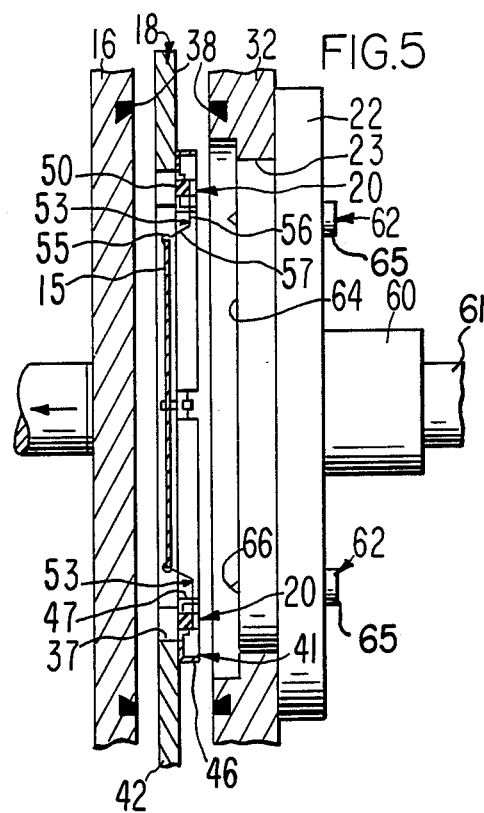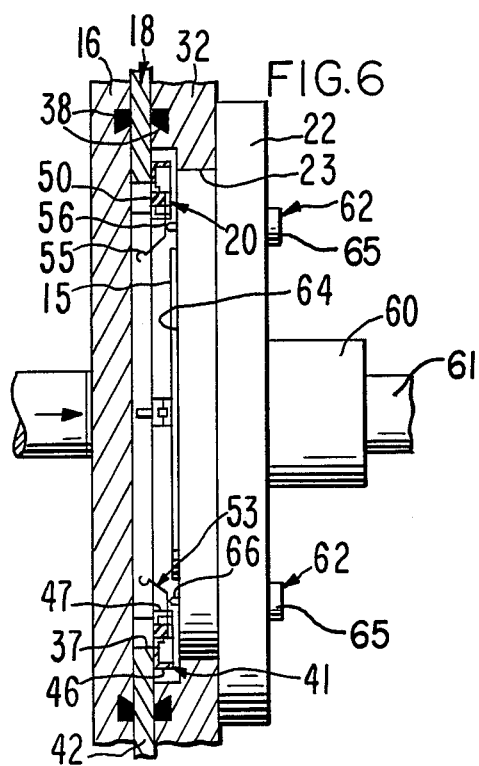

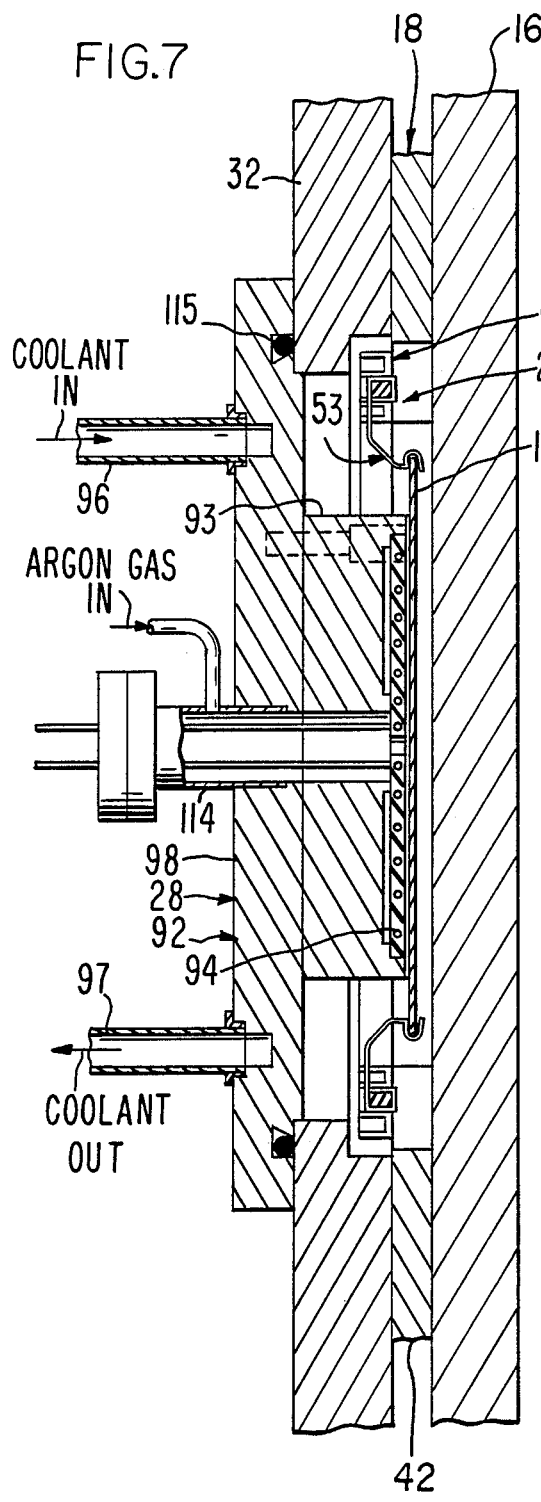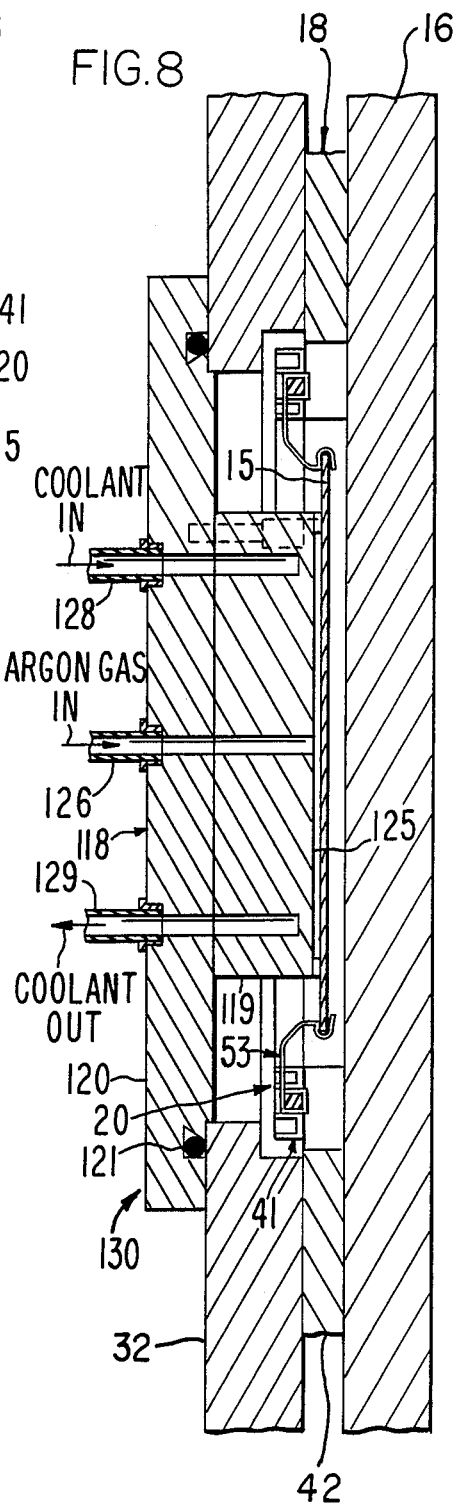

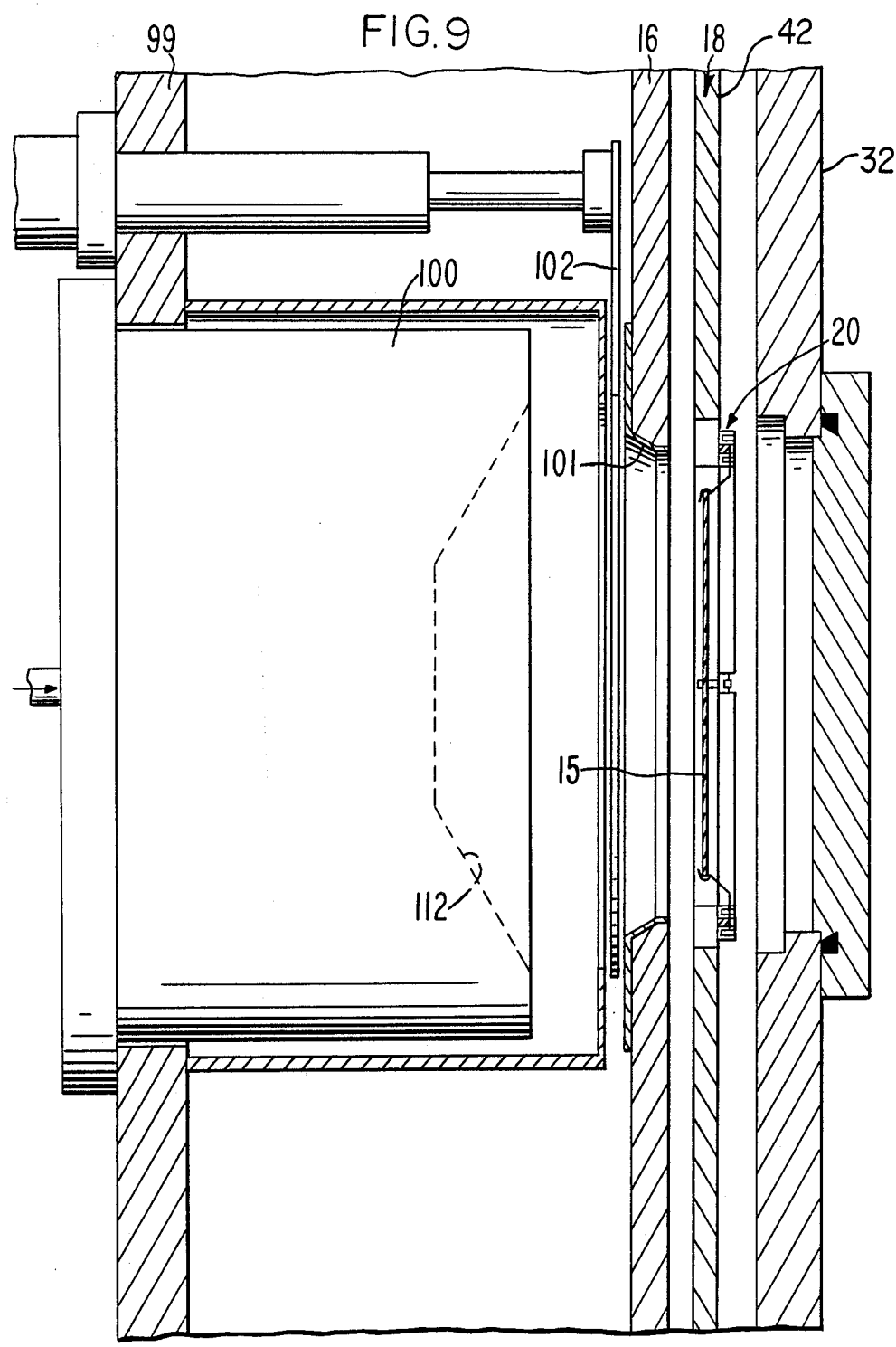

WAFER COATING SYSTEM

BACKGROUND OF THE INVENTION

The present invention relates to the coating of thin substrates by deposition under vacuum. More particularly, the field of the invention is metallization of semiconductor wafers, and apparatus for effecting such metallization of wafers individually, and on a serial, continuous basis. Semiconductor wafer fabrication techniques have evolved rapidly over the past decade. Individual microcircuit devices have become progressively smaller, thereby increasing the number of such devices that can be put onto a wafer of a given size. Additionally, wafers of larger diameter are coming into use. A few years ago wafers of 2-inch diameter were commonplace, and 3-inch diameter wafers were considered large. Today much of the device fabrication is done with 4-inch diameter wafers and widespread use of 5-inch wafers within a very few years is foreseen. The reductions in device size, coupled with the increased size of wafers, have served to greatly increase the economic value of individual wafers, and thus the need to process and metallize such wafers in an improved manner.

Most semiconductor and microcircuit fabrication techniques require deposition of metallic coatings of high quality upon the semiconductor wafer upon which the microcircuits are defined. Whether a coating is of "high" quality will of course ultimately be determined by the degree of satisfaction with the ultimate yield of microcircuit devices from the wafer, and their utility, for example, as meeting the higher military or industrial standards, or the lesser consumer and hobbyist standards. Although therefore difficult to quantify, it is generally agreed that metallization quality, and thus ultimate quality and quantity of yield, will in turn be a function of the following factors: uniformity of coverage upon the uppermost and main planar surface of the wafer ("planar coverage"); contamination levels incorporated into the final coating; defect level caused by debris; symmetry and homogeneity, or in other words freedom from "layering" and the manner of distribution of contaminant levels in the film; the degree of reproducibility and control, especially of temperatures during coating deposition; and step coverage, that is, the continuity and evenness of the coating across not only the main plane of the surface, but also the sides and bottoms of such features within the surface as steps, grooves, depressions, and raised portions which define the microcircuits.

Some of these characteristics are harder to achieve or are more critical than others, or have been thought to require definite specialized processing steps to achieve. For example, because of the constraints of geometry, step coverage has been a particularly difficult requirement to fulfill. The sidewalls of the steps and grooves are generally perpendicular to the uppermost surface of the main plane of the wafer, and may face both inwardly and outwardly of the wafer center. Covering of such perpendicular surfaces, particularly the outer-facing ones, while at the same time covering the planar surfaces, is obviously an especially difficult problem, yet such "step coverage" is of particular importance in determining the quality of the metallization overall. It has generally been thought that in order to achieve the required uniformity of planar surface coverage as well as adequate step coverage, relative motion between the wafers and the deposition source during coating deposition is necessary. However, such motion carries with it certain disadvantages, especially the heightened possibility of generation of debris, as by dislodgement of deposits of coating material on various internal structures of the apparatus due to the motion, a heightened possibility of mechanical shock and vibration damage to the wafer, and the build-up of deposition on the wafers in a nonsymmetrical and inhomogeneous fashion, as will be further explained below. Naturally, contamination level will depend on the maintenance of the quality of the vacuum environment during deposition and the concentration of contaminants relative to the speed of deposition. Thus the adequacy of "outgassing", or the evacuation of gas and vapors from the wafer and accompanying wafer supports which are introduced into the coating chamber will also be important.

The manner in which the prior art has attempted to achieve one or more of the above characteristics, and the attendant difficulties and trade-offs involved in achieving the above criteria of coating quality, may be best appreciated by considering the two main types of vacuum deposition systems which are in current use for metallizing wafers: batch and load lock. A typical batch system comprises a pumping station, an evacuable bell jar, an isolation valve between the pumping station and the bell jar, heat lamps, one or more deposition sources, and planetary fixtures which hold the semiconductor wafers and rotate them above the deposition source or sources. At the start of a deposition cycle the isolation valve is closed and the bell jar is open. Wafers are loaded manually from cassettes into the planetary fixtures (a load of 75 wafers of 3-inch diameter is typical). The planetary fixtures are then mounted in the bell jar, the bell jar closed, and the system evacuated. After a prescribed base pressure is reached, the wafers are further outgassed through the application of radiant energy from the heat lamps. In some cases the wafers are sputter-etch cleaned prior to the start of deposition. A typical coating is aluminum or an aluminum alloy sputtered onto the wafer to provide interconnect metallization. In order to achieve the required coating uniformity and step coverage, relative motion is provided by rotation of the planetary fixtures. After deposition, the wafer and system are allowed to cool, the isolation valve is closed, the bell jar vented to atmosphere, the bell jar opened, and the planetary fixtures are removed and unloaded manually into cassettes. This completes a typical cycle, which takes approximately 1 hour.

Although such batch systems are in widespread use in production today for metallizing semiconductor wafers, certain of their characteristics pose limitations and disadvantages. For one, the entire relatively large batch of wafers is inherently "at risk" of a partial or total loss during the deposition cycle. The manual loading of wafers from cassettes into planetary fixtures provides ample opportunity for contamination and breakage. Air exposure of the entire system inside the bell jar for loading and unloading leads to possible contamination and adds a very large outgassing load for the vacuum pumps to contend with (the outgassing area ascribable to the wafers alone is typically less than ten percent (10%) of the total air-exposed area which must be outgassed). Long deposition throw distances (typically 6 to 14 inches) from the source are needed to obtain the large area coverage for the many wafers to be coated within the batch system. This leads to low deposition rates (typically 600 angstroms per minute for sputter deposition source), which make the films more susceptible to poisoning by reaction with background gases, and thus more sensitive to the quality of the evacuated environment. Outgassing of the wafers and the air-exposed areas of the system is accelerated by application of radiant energy from heat lamps, but since the wafers are in uncertain thermal contact with the planetary fixtures, their temperatures are also uncertain. Moreover, the heating source normally cannot be operated during sputter deposition, so that the wafers cool in an uncontrolled fashion from the temperature attained during preheat. Lack of control of wafer temperature during deposition limits certain aspects of film characteristics which can be reliably and reproducibly attained. Of course the mechanical motion of the planetary fixtures for achieving uniformity and step coverage can dislodge particles of coating material deposited elsewhere within the system other than on the wafers, which in turn can cause debris to become attached to the wafers, in turn reducing yield of good devices.

A typical load lock system comprises a pumping station, an evacuable processing chamber, an isolation valve between the pumping station and the processing chamber, a heating station, a deposition source, a load lock, and a platen transport system. At the start of a deposition cycle, wafers are loaded manually from a cassette into a metal platen (a 12-inch by 12-inch platen size is typical), which then acts as a carrier for the wafers during their journey through the load lock and processing chamber. After introduction through the load lock into the processing chamber, the platens and wafers are transported to the heating station, where they are further outgassed by the application of radiant energy. Additional cleaning of the wafers by means of sputter etch may also be performed at the heating station. Metal film deposition is accomplished by translating the platen and wafers relatively slowly past the deposition source, which may be a planar magnetron type of sputtering source with a rectangular erosion pattern, with the long dimension of the erosion pattern being greater than the platen width. Relatively high deposition rates (10,000 angstroms per minute) are achieved by moving the platen past the sputter source over a path which passes the wafers within several inches of the sputter source. After deposition, the platen and wafer are returned to the load lock where they pass from the processing chamber back to atmosphere. The wafers are then unloaded manually back into a cassette. This completes a typical cycle, which takes typically 10 to 15 minutes. In another type of load lock system, the wafers are mounted on an annular plate which rotates past the deposition source. Each wafer makes multiple passes below the deposition source until a film of sufficient thickness is built up.

The above load lock systems overcome some of the disadvantages of batch systems, but not all. Of primary importance is the fact that the use of a load lock allows wafers on a platen to be introduced into and removed from the processing chamber without allowing the processing chamber pressure to rise to atmospheric. This greatly reduces the amount of air-exposed surface that must be outgassed prior to deposition. While the processing chamber does need to be opened to atmosphere periodically (for cleaning and for replacing deposition targets), the frequency of such air exposure is much less than with batch systems.

Another important factor is that the size of the wafer load which is "at risk", that is, subject to being rejected due to a defect or failure of the process, is significantly smaller in the load lock system (16 3-inch wafers in the first load lock system, compared with 75 3-inch wafers in the batch system in the above example). Because the number of wafers per load is much smaller with the load lock system, it is not necessary to employ the long deposition throw distances required with batch systems. Higher deposition rates are therefore attainable by closer coupling between wafer and source.

Despite the advantages afforded by load lock systems, many disadvantages and shortcomings still remain. In both batch and load lock systems, wafers are typically transferred manually between platen and cassette, with attendant risks of contamination and breakage. Although the use of the load lock avoids exposure of the processing chamber to the atmosphere, the platen which carries the wafers is air-exposed on each load and unload cycle. Thus its surfaces must also be outgassed, which raises the total outgassing load well beyond that of only the wafers themselves. In addition, sputtered deposits that build up on the platen become stressed due to repeated mechanical shock and air exposure, leading to flaking and debris generation. As with batch systems, wafers are still in uncertain thermal contact with their carrier. Controls over wafer temperature during outgassing and during deposition remain inadequate. The metal films are put down on the wafers in a non-symmetrical fashion, since the film deposited on the wafer builds up in different ways depending upon its location on the platen, i.e., whether the wafer is outboard, inboard, approaching the source, or moving away from the source. Translation of the platen during deposition to provide uniformity and step coverage heightens the risk of generation of debris and flakes, and thus contamination of the wafers. In certain load lock systems, symmetry and homogeneity are further compromised by causing the wafer to make multiple passes below the deposition source. Thus the metal film is deposited in a "layered" fashion because the deposition rate tapers off to almost nothing when the wafers are rotating in a region remote from the deposition source. The low rates of deposition in such regions heighten the risk of contamination due to incorporation of background gases into growing film, and non-uniformities in the distribution of any contaminants which may be present result from the non-uniformities in deposition rate.

Even though a much smaller number of wafers is being processed at any one time in load lock systems as compared with batch systems, a significant number of wafers still remains "at risk". From this point of view, it would be best to process wafers individually on a serial continuous basis, but the time needed for adequate pumpdown of the load lock during loading and unloading, and for wafer outgassing and the outgassing of wafer supports, coupled with the time needed to coat a wafer individually in an adequate manner, has rendered the concept of such individual processing impractical until now as compared to batch systems or load lock systems handling a plurality of wafers with each load. It would also be much better from the viewpoint of prevention of debris generation and consequent reduction in yield of good microcircuit devices, as well as lessening the risk of abrasion and mechanical shock and vibration, to hold wafers stationary during coating deposition. However, as we have seen, this has been considered inconsistent with the need to obtain adequate deposition uniformity and step coverage, since this normally requires establishing relative motion between the source and wafer. Further, there has been no basis for expecting greater control over reproducibility and temperature of the coating process in a individual wafer processing system as opposed to a batch or load lock system coating a plurality of wafers with each load.

Accordingly, an object of the invention is to provide apparatus for rapidly coating wafers individually with a higher quality coating than possible previously.

A related object of the invention is to provide apparatus for depositing metallization layers of superior quality with respect to the aggregate considerations of step coverage, uniformity, symmetry and homogeneity, contamination level, debris damage, and reproducibility.

Also an object of the invention is to provide apparatus for rapidly coating wafers individually with improved step coverage and good uniformity.

Another related object of the invention is to provide an improved load lock system for metallizing wafers individually yet at a high rate.

Yet another object of the invention is to provide an improved load lock system for metallizing semiconductor wafers individually on a production-line basis with enhanced quality, including uniformity and step coverage.

A related object is to provide a system for coating wafers which reduces the number of wafers at risk at any one time due to processing.

Another related object is to provide a system for metallization or other vacuum processing of wafers individually on a serial continuous basis, with a plurality of work stations operating simultaneously on individual wafers.

Also a related object is to reduce the outgassing load and minimize disturbance to the evacuated coating environment due to introduction of wafers into a load lock system for coating.

Yet another object of the invention is to improve the yield of microcircuit devices subsequently derived from the wafer by reducing generation of debris and the probability of damage from abrasion and incorporation of contaminants.

Yet another object is to provide a load lock type system which accomplishes transport between various work stations and into and from the vacuum regions without the use of platen-like supports for the wafers.

Also a related object of the invention is to provide a load lock type system as above which does not use platen-like wafer supports, in which loading and unloading are effected of certain wafers while yet others are being processed.

A further related object is to provide a system as above which is compatible with automatic wafer handling from cassettes.

Also a related object is to provide improved control over wafers, especially their temperature, throughout the processing thereof.

Yet a further object of the invention is to provide a system for production-line use in which reliability, maintainability, and ease of use are improved.

SUMMARY OF THE INVENTION

The broadest objects of the invention are met by providing apparatus for coating a wafer individually, which includes a ring-shaped sputtering source emitting coating material and having a diameter larger than that of one of the wafers, means for locating an individual one of the wafers in facing stationary relationship to the source, and at a distance less than the diameter of the source, as well as means for maintaining the source and wafer in an argon environment of up to 20 microns pressure (1 micron = $10^{-3}$ millimeters of mercury = 1 millitorr = 0.133 Pa) during coating of the wafer. In this manner a coating of improved quality with good uniformity is rapidly deposited on the wafer without need for relative motion between wafer and source and the added complexity and debris generation risk attendant thereto.

The objects of the invention are also met by providing apparatus for repetitively sputter coating individual wafers in minimal time, useful with vacuum chamber means continuously maintaining a controlled subatmospheric environment. The apparatus includes internal wafer support means positioned within the chamber immediately inside of the entrance thereof, including means for releasably and resiliently gripping edgewise an individual wafer, to immediately accept a wafer upon insertion and permit instant release and removal upon completion of coating. Also included is a sputtering source mounted in the chamber and having a cathode of circular outline emitting coating material upon the wafer in a pattern approximating that from a distributed ring source. The source has a diameter which is larger than that of the wafer and is spaced from the wafer by a distance less than that of the source diameter. The wafer support means holds the wafer stationary during coating. Finally, the apparatus includes load lock means including a movable member within the chamber to seal the wafer support means off from the remainder of the chamber interior and when the door of the entrance is opened, isolating the wafer and support means from the chamber environment during insertion and removal of a wafer. In this manner, individual coating of wafers can be repetitively performed, with disturbances to the chamber environment by outside wafer support expedients, consequent contaminants, and large load lock volumes minimized, while overall wafer coating time is improved.

Objects of the invention are also met by apparatus for individually processing wafers continuously in a controlled subatmospheric environment, which includes a vacuum chamber having a first opening in a first wall thereof and a door for closure of the opening, at least one wafer processing means mounted in a wall of the chamber and defining at least one processing location of the chamber spaced from the first opening, and movable carrier means within the chamber movable between the first opening and the processing location. The carrier means is provided with at least two apertures and spaced a first distance to enable the apertures to be aligned respectively with the first opening and the processing location. Each of the carrier apertures mounts clip means for releasably and resiliently gripping a wafer. The apparatus also includes closure means within the chamber for closing off one of the carrier apertures when said aperture aligns with the first chamber opening, the closure means and chamber defining therebetween a small load lock volume with the closure means sealing off the aperture from the chamber when the chamber door is opened to load or unload a wafer into the clip means. In this manner wafers can be continually serially introduced into the vacuum chamber with minimal disturbance of the controlled atmosphere therein, and the wafers individually processed at the processing location while loading and unloading of another wafer takes place at the load lock without use of external wafer support means, the presence of which would greatly increase the gas load to be eliminated by the load lock and chamber, as well as increasing the possibility of contaminants. Furthermore, the load lock volume is minimized to only that absolutely necessary to accommodate a single wafer, thus also reducing the amount of pumpdown load for the load lock and chamber.

In one preferred embodiment, the movable carrier means may be provided in the form of a disc-like transfer plate mounted for rotation about its axis with various wafer processing stations symetrically disposed around the same axis Besides sputtering stations, the stations may also be heating or cooling stations, and the heating, for example, may be applied to the side of the wafer opposite that of the sputtering deposition, since the clip means support the wafers edgewise, thereby allowing processing of both sides thereof. The wafer transfer plate preferably rotates in a vertical plane to better combat accumulation of debris on the wafers. When fully loaded, the apparatus limits the number of wafers at risk at any one time to only those loaded in the wafer transfer plate, and enables several processing operations to be carried on at the same time, for example, coating of one wafer simultaneously with the heating of another and with the unloading and loading of still others. The use of the internal wafer clip support means, thin load lock, and individual processing of wafers enables easy loading and unloading, including simplified automatic loading. In one particular aspect, a vertically-acting blade-like elevator means raises a wafer edgewise to a point immediately adjacent the chamber entrance. Vacuum means associated with the door of the chamber then grip the rear surface of the wafer and propel same into the clip means as the door is closed, thereby loading the load lock and sealing same simultaneously. Further details of a fully automatic system for loading the vacuum processing chamber from a conveyor-driven cassette containing a plurality of wafers to be coated may be found in the co-pending application of G. L. Coad, R. H. Shaw, and M. A. Hutchinson for "Wafer Transfer System", filed contemporaneously herewith, now U.S. Pat. No. 4,311,427. Similarly, the details of the means for resiliently supporting the wafers within the vacuum chamber and associated means for aiding the loading and unloading of same into said supports within a chamber may be found in the co-pending application of R. H. Shaw for "Wafer Support Assembly", filed contemporanously herewith, now U.S. Pat. No. 4,306,731.

BRIEF DESCRIPTION OF THE DRAWINGS

FIG. 4 is a cross-sectional elevational view of the door and load lock of FIGS. 1 through 3, showing the manner in which the door assembly loads a wafer into the load lock, and the manner in which the load lock is sealed from the remainder of the processing chamber interior;

FIG. 5 is a view similar to FIG. 4, showing the relative positions of the elements of the load lock upon completion of loading of the wafer therewithin;

FIG. 6 is a view similar to FIGS. 4 and 5, showing the position of the wafer and the load lock elements just subsequent to the extraction of a wafer from the internal wafer support assembly, and prior to the opening of the door, or just before the loading of a wafer into the internal wafer support assembly immediately after closure of the door for loading;

FIG. 7 is a cross-sectional elevational view taken across line 7—7 of FIG. 1, showing a wafer heating station within the chamber of FIG. 1;

FIG. 8 is an elevational cross-sectional view taken along line 8—8 of FIG. 1, showing a wafer cooling station within the wafer processing chamber of FIG. 1;

FIG. 9 is a cross-sectional elevational view taken along line 9—9 of FIG. 1, showing the wafer sputtering station of the chamber of FIGS. 1 and 2;

DETAILED DESCRIPTION

Figure 1:
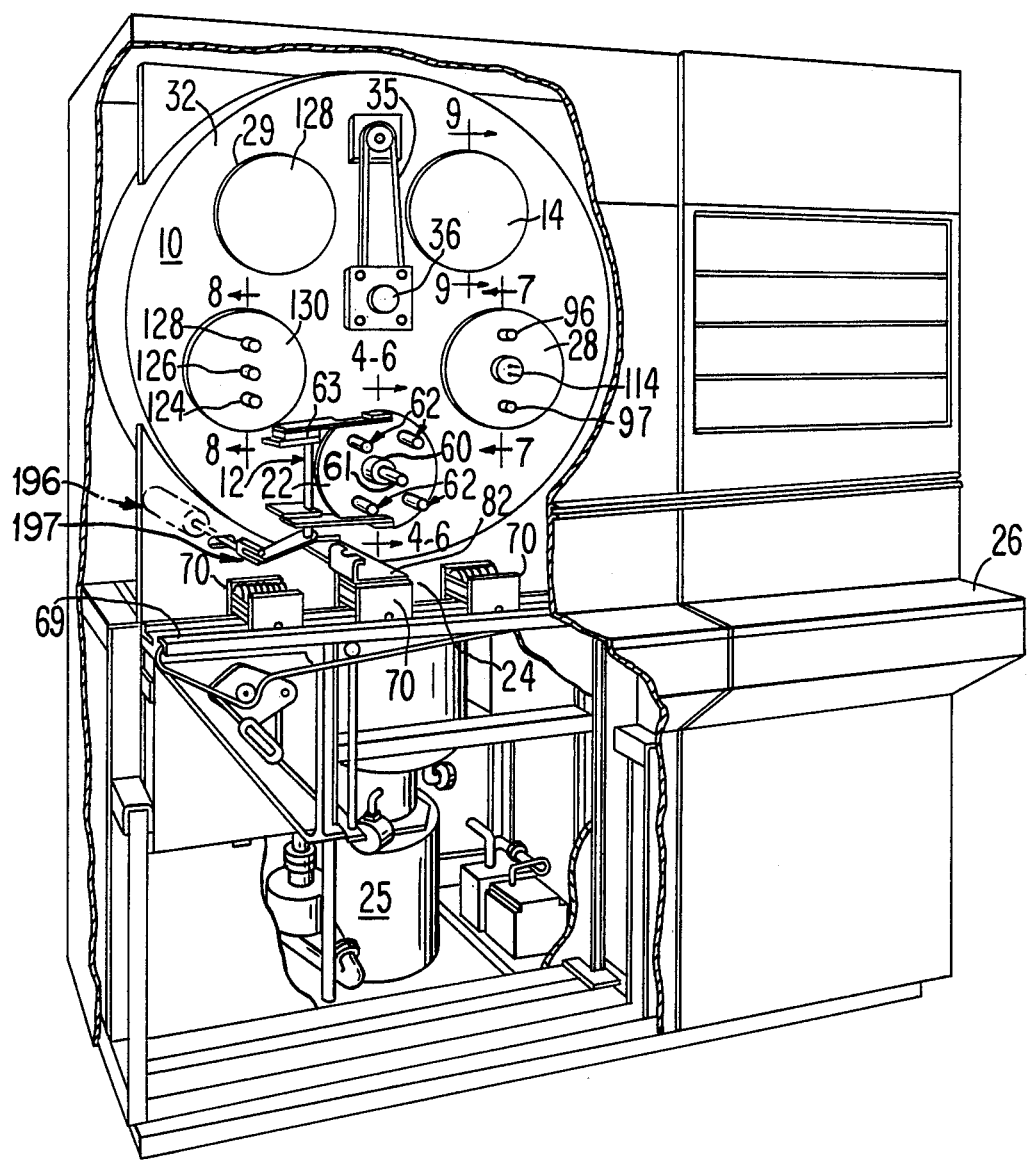
FIG. 1 is an elevational view of the complete wafer coating system of the invention, showing the main cylindrical processing chamber, the door arrangement at the entrance of the load lock to the chamber, and the four remaining work stations of the processing chamber, together with portions of the wafer cassette load/unload assembly.

The wafer coating system of FIG. 1 principally includes a generally cylindrical vacuum processing chamber 10 having five work stations, one of which comprises load lock arrangement 12; and one of which comprises coating station 14. Remaining further elements of the coating system found within chamber 10 may be seen in more detail in FIG. 2, which also shows a wafer 15 within load lock 12; and also a wafer at coating station 14. Further elements include pressure plate 16, wafer carrier plate 42 of carrier plate assembly 18, and clip assemblies 20 (better shown in FIG. 3), by which a wafer is retained within wafer carrier plate assembly 18. Door assembly 22, which seals the entrance opening 23 of chamber 10, and which cooperates with the just mentioned elements to form the chamber load lock arrangement 12, completes the principal elements of processing chamber 10. These elements, together with cassette load/unload assembly 24 and the various ancillary vacuum pumps 25 for chamber and load lock evacuation, and control means, are all housed compactly in cabinet 26.

The system desirably includes several other work stations other than load lock arrangement 12 and coating station 14, in particular wafer heating station 28, auxiliary station 29, and wafer cooling station 130. All five work stations are equally spaced laterally from each other and from the central axis 36 of the vacuum chamber. Although five stations are provided, the design could be equally well adapted to both a greater or fewer number of stations. Also included are at least two pneumatic rams 30 and 31 which function to drive pressure plate 16 and wafer carrier plate assembly 18 against the front wall 32 of chamber 10, and carrier plate drive 35, which centrally mounts carrier plate assembly 18, which is circular and of nearly the diameter of front wall 32, for rotation about the central axis 36 of the vacuum processing chamber.

In general, wafers are individually presented and loaded by door assembly 22 into load lock arrangement 12 and thereby within wafer carrier plate 42. The wafer is then passed in turn to each of the work stations, where it is heated for completion of outgassing and/or sputter-etch cleaned, coated, optionally coated with a second layer, cooled, and then returned again to load lock 12 for removal from wafer carrier plate assembly 18, again by door assembly 22. Although the foregoing generally-described system is a rotary one and a multi-station one, the load lock and coating steps are equally applicable to a single station or dual station configuration, or a non-rotary or in-line arrangement as well.

Now considering the system in more detail from the view point of an incoming wafer, the load lock arrangement 12 through which a wafer 15 must be passed in order to enter the evacuated environment of the chamber is of key importance. FIGS. 4–6 are especially important in appreciating the operation of the movable elements of load lock 12. As pointed out above, the load lock is defined by a sandwich arrangement of elements between the chamber door assembly in its closed position against the front wall of the processing chamber and the pressure plate in its driven position. The load lock is built around a circular aperture 37 within wafer carrier plate assembly 18, which is positioned internally of the chamber just inside the chamber entrance 23 associated with load lock 12, with plate assembly 18 generally parallel to wall 32 and the pressure plate 16, positioned within the chamber rearwardly of plate assembly 18. Wafer 15 is loaded and held within the load lock and within the plate assembly by means which will be described below. The controlled subatmospheric environment which may be provided within chamber 10 for certain wafer processing operations may be, for example, up to 20 microns of argon or other inert gas for sputter coating operations. Because of this evacuated environment, the load lock region must be sealed off from the remainder of the chamber interior whenever door 22 is open in order to preserve the evacuated environment. Pressure plate 16 serves the function of isolating the load lock area from the chamber interior (and also several other functions simultaneously at other work stations, as will be shown below). Pneumatic rams 30 and 31, mounted to the rear plate of the processing chamber, drive the pressure plate and carrier plate plate assembly against front chamber wall 32, with pneumatic ram 30 being applied particularly to the pressure plate concentrically with load lock arrangement 12 to effect the sealing of the load lock. Both pressure plate 16 and chamber front wall 32 are equipped with O-rings 38 arranged in a circular pattern concentric with chamber entrance 23 which provide vacuum seals in the sandwich arrangement of elements defining the load lock. Chamber door assembly 22, which in its closed position seals against the outside surface of chamber front wall 32 and also includes a concentric O-ring 39 to provide the vacuum seal, completes the load lock by sealing off the chamber entrance 23 from the outside atmosphere. FIGS. 4 and 6 show the completed load lock, with pressure plate 16 in its forward, advanced position, compressing plate assembly 18 against chamber wall 32, and sealing off aperture 37; and door 22 closed to seal off chamber entrance 23 to form the load lock about aperture 37, which is only of a size no larger than necessary to accommodate a single wafer. It may be seen that an unusually thin low-volume load lock is thereby defined with a minimum of elements, and of a minimum size necessary to accommodate wafer 15 therewithin. For further details of the load lock arrangement, see the commonly owned U.S. Pat. No. 4,311,427 "Wafer Transfer System". FIG. 5 shows pressure plate 16 in its withdrawn, rest position, and with the wafer already secured within plate assembly 18 within the chamber.

Figure 2:
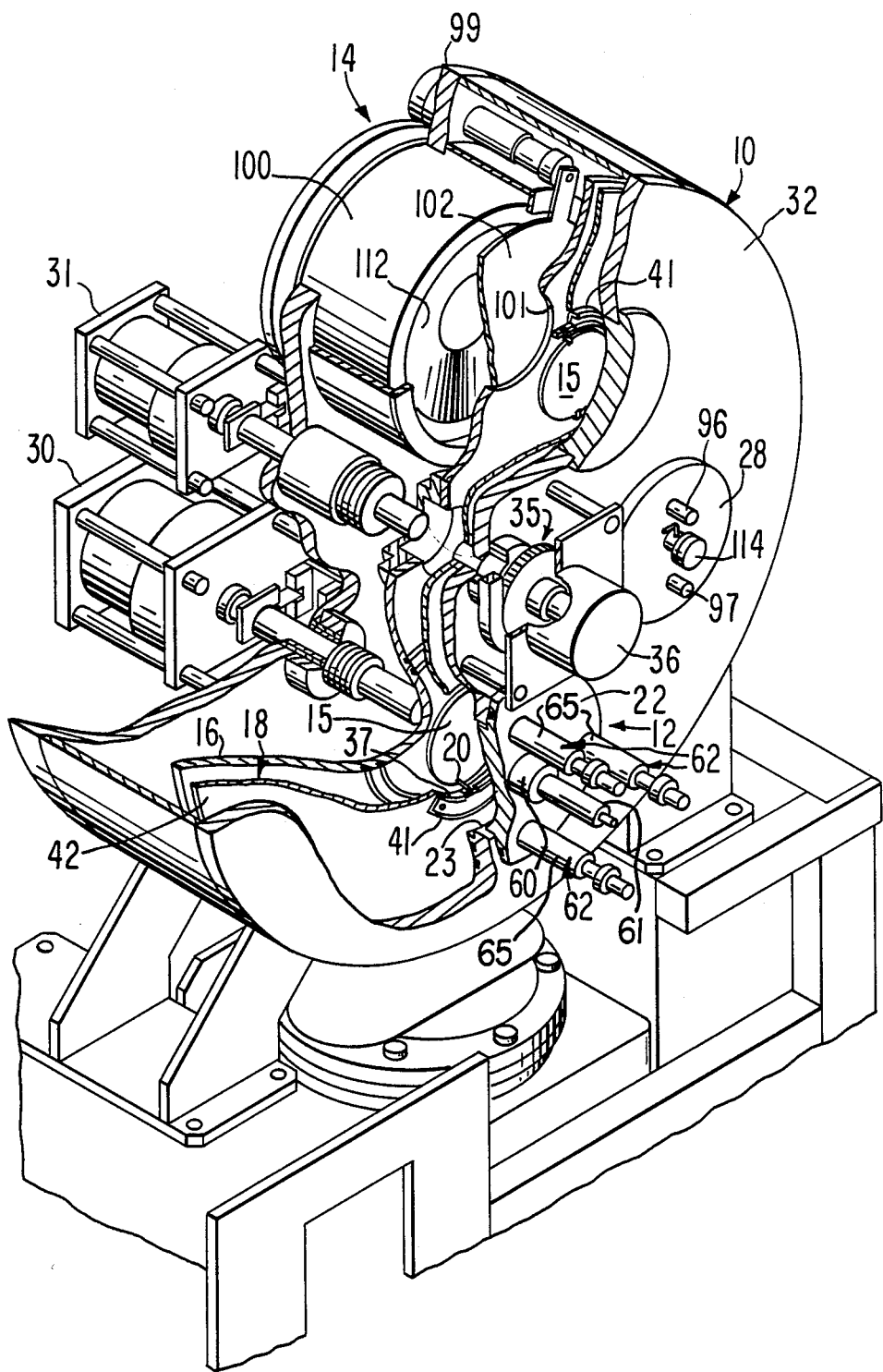
FIG. 2 is a broken-away perspective view of the processing chamber of FIG. 1, showing the load lock and sputter coating stations in more detail.

Cooperating with this thin load lock arrangement is wafer carrier plate assembly 18, which includes a plurality of circular apertures such as at 37 (as best seen in FIG. 2) matching the number and spacing of work stations within chamber 10. The apertures 37 are of a diameter larger than the wafers, are equally spaced from each other, and centered at the same radial distance from the central axis of the processing chamber. The aforementioned work stations are likewise spaced, so that when any aperture of the wafer carrier plate assembly 18 is aligned with any work station of the processing chamber, the remaining apertures are each similarly aligned with a respective one of the remaining work stations. Thus, if a wafer is secured within each of the apertures of carrier plate 18 assembly, each of such wafers can be individually processed at a work station simultaneously with the processing of other wafers respectively at the remaining work stations. In this manner, a wafer is individually processed at a given station, yet during the same time, several other wafers may also undergo other operations at the remaining work stations. In particular, while a wafer is being unloaded and/or loaded at load lock 12, another wafer may be coated at coating station 14, while still another wafer may be heated at heating station 28. Carrier plate drive 35 intermittently operates to move plate assembly 18 by the distance of one station so as to serially present each of the wafers in turn to each of the processing stations in a counterclockwise direction, until a given wafer finally returns to the load lock for unloading therefrom.

As the wafer is transported from work station to work station as above described, it is important that the wafer be supported within carrier plate assembly 18 so as to avoid any risk of mechanical damage and abrasion due to being moved about, and generally so as to be protected from mechanical shock, vibration, and abrasion. To this end, wafer carrier aperture 37 is of a diameter such that both a wafer and a set of clip assemblies 20 can be accommodated within the periphery of the aperture, and recessed and parallel with the carrier plate, thereby protecting the wafer. The set of thin edgewise-acting clip assemblies also is important to the formation of the thin load lock arrangement 12, and edgewise resiliently supports the wafer in an upright position within plate assembly 18. An especially advantageous form of such an edgewise acting clip assembly is shown in cross section in FIGS. 4 through 8, and is disclosed in detail in the aforementioned commonly assigned U.S. Pat. No. 4,305,731 "Wafer Support Assembly." A set of four clip assemblies 20 is mounted within retaining rings 41 which are removably attached to the disc-like circular wafer carrier plate 42 concentrically with each of plate apertures 37, thus forming the complete wafer carrier plate assembly 18. This arrangement mounts a set of clip assemblies 20 in spaced relationship within the periphery of each circular aperture 37. Retaining rings 41 are of U-shaped cross section, with each having flanges 46 and 47 defining the inner and outer peripheries thereof, and clip assemblies 20 are recessed within these flanges. Although it is preferred that four clip assemblies be used within an aperture 37, it is possible to use three, or a number greater than four. However, a set of four has been found to provide greater reliability than three.

As may be seen in any of the FIGS. 3 through 8, clip assemblies 20 each include a block 50 of generally rectangular cross section, which may be of insulating material for applications such as sputter etch for which electrical isolation of the wafer is desired, and an elongated spring clip 53 firmly engaged in wraparound fashion about block 50. Each clip 53 includes at the end thereof opposite the block an arcuate finger portion or tip 55, which is of a curvature in radius appropriate to gripping an edge of a wafer. Extending from block 50 is proximal flat portion 56, which lies within a plane closely adjacent and parallel with the plane defined by plate aperture 37. On the other hand, distal portion 57 is angled away from portion 56 down toward the plane of plate aperture 37, and defines an obtuse angle with portion 56. This clip arrangement results in a plurality of arcuate tips 55 lying on a circular pattern of diameter somewhat less than that of a typical wafer 15 (such circular pattern also lies within the plane of wafer carrier plate 42).

Wafer insertion into load lock 12 may be effected manually by simply pushing a wafer by its edge or rear face into clip assemblies 20. This will, however, involve some edge rubbing of the wafer against distal portion 56, to spread apart the clips somewhat to accept the wafer within tips 55. In order to insert a wafer without such rubbing contact therewith, the clips must first be slightly spread, and then allowed to rebound against the edge of the wafer upon insertion thereof into the load lock. Although both wafer insertion and clip spreading may be done manually, it is far preferable to avoid all such manual operations, and the consequent added risk of damage, error, and contamination associated therewith. Chamber door assembly 22 carries thereon a vacuum chuck 60 centrally axially therethrough, and a plurality of clip actuating means 62 near the periphery thereof. These elements, along with wafer cassette load-/unload assembly 24, provide an automated wafer loading and unloading arrangement for load lock 12 which avoids all such manual handling of the wafers, and automates the loading process.

Figure 3:
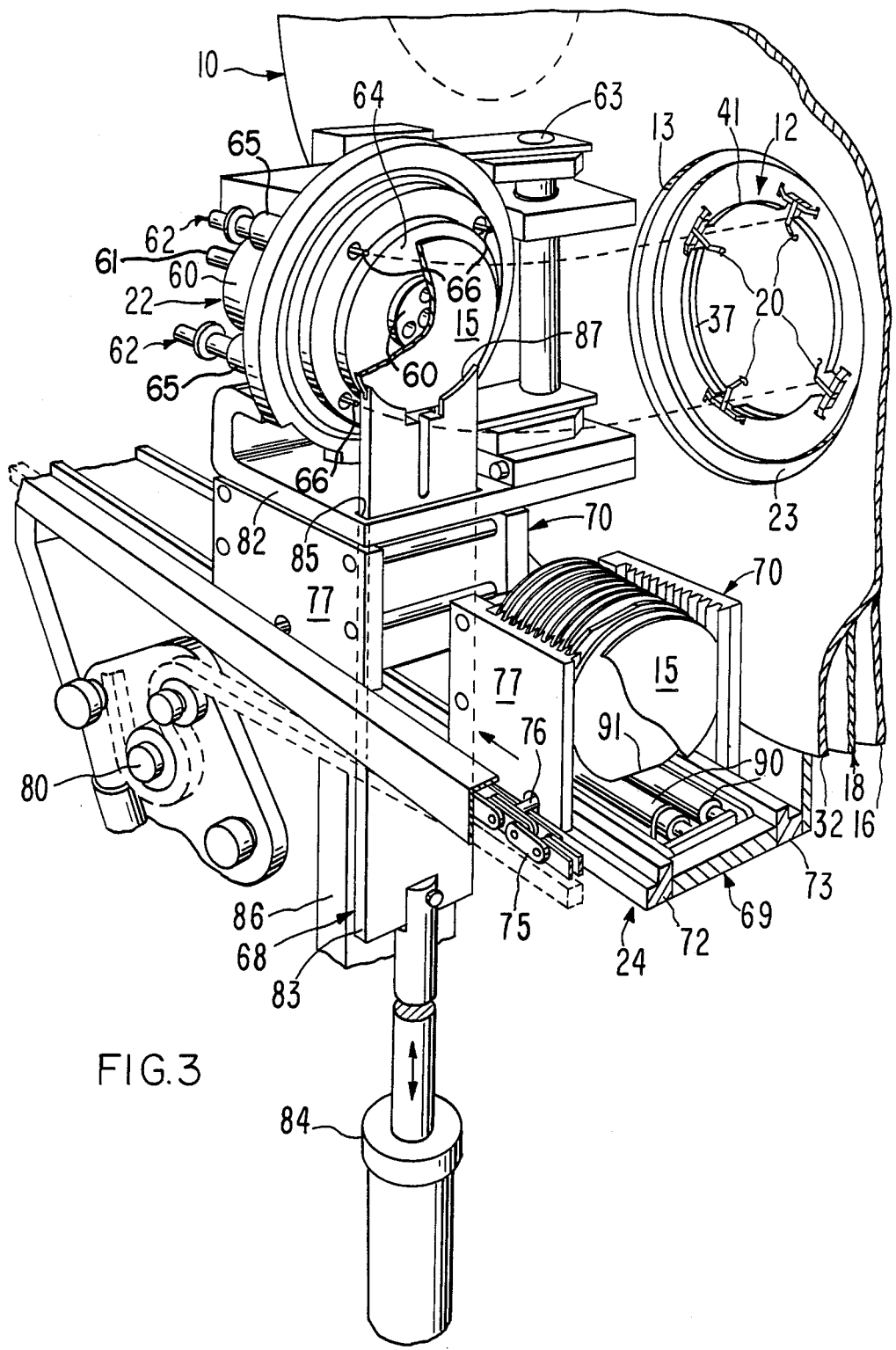
FIG. 3 is a perspective view of the cassette load/unload assembly of FIG. 1, showing its manner of cooperation with cassettes of vertically-oriented wafers and the door assembly of the processing chamber, and the manner in which wafers are transferred therebetween and into the chamber load lock.

As thus seen in FIGS. 1 and 3, chamber door assembly 22 is attached to front wall 32 of chamber 10 by a heavy-duty hinge 63 having a vertical axis, to allow the door to open and close in a conventional manner to a fully open position as shown, wherein the door and its inside face 64 are vertical and perpendicular to the plane of chamber entrance 23, as well as to plate assembly 18. As shown in FIG. 1, door assembly 22 is moved between its open and closed positions by means of a conventional push-pull actuator 196, and pivot linkage 197 which is attached to hinge 63 for causing rotation of the hinge and door. Vacuum chuck 60, which extends axially and centrally through the door so that the active end thereof forms part of the inside face 64 of the door, engages a wafer presented vertically to the inside face of the door and holds the wafer by vacuum suction as the door is closed, whereupon the vacuum chuck axially extends from the inner door face as shown in FIG. 4 to carry the wafer into engagement with clip assemblies 20. The vacuum chuck will then withdraw, and wafer 15 is held in the chamber by the clip assemblies and undergoes processing, and movement to the various work stations in turn by rotation of plate assembly 18. The above-described axial movement of chuck 60 relative to the door face 64 is accomplished by means of a conventional pneumatic cylinder 61. In this preferred embodiment, the vertical presentation of the wafer to the inside face 64 of the door is effected by load/unload assembly 24, as will be further detailed below.

It should be noted that the load lock arrangement, wafer carrier plate assembly 18, and door assembly 22 need not be limited to a vertical orientation, although this is preferred to help obviate any possibility of debris settling upon a surface of the wafer. The clip assembly, carrier plate and load lock arrangement of the invention, as well as all of the work stations, function equally well if oriented horizontally. Indeed, although the load-/unload assembly 24 for the vertically-oriented wafer cassettes is meant for vertical operation, the door assembly 22 could easily be made to load wafers into the load lock in a horizontal plane, yet accept wafers in a vertical orientation, by suitable modification of its manner of mounting to the chamber wall in a conventional manner.

As noted above, it is preferable to avoid simply loading a wafer into the clip assemblies 20 within the load lock by pushing a wafer against the angled distal portion 57 of the clips. In order to insert a wafer without such rubbing contact, the clips must first be slightly spread, and then allowed to rebound against the edge of the wafer upon insertion thereof into the load lock. This is accomplished automatically as the wafer is being inserted by vacuum chuck 60 by four clip actuating means 62 mounted within the door as aforementioned. Each clip actuating means 62 is mounted so as to be in registration with a corresponding one of clip assemblies 20 when the door is in its closed position. Each clip actuating means 62, shown in detail FIG. 4, includes a pneumatic cylinder 65, and a contact pin 66 which moves axially inwardly and outwardly, and is propelled by cylinder 65. Pins 66 are each in registration with one of flat proximal clip portions 56 when the door is in its closed position. With door 22 closed, pins 66 are extended just prior to insertion of a wafer; or as a wafer is to be withdrawn. The pressure of a pin 66 against the facing flat clip proximal portion 56 presses the clip and causes the tip 55 to swing back and outwardly, thereby releasing the clips, to facilitate insertion or removal of a wafer without rubbing contact therewith.

During wafer unloading after completion of the wafer processing, these operations are reversed, with the chuck again extending and applying vacuum to the backside of the wafer to engage same, with the clip actuating means again cooperating to release the clips, whereupon the door opens and the chuck retains the wafer on the inside face of the door by vacuum suction until the wafer is off-loaded by load/unload assembly 24.

As we have seen, when in its fully opened position, door assembly 22 is poised to accept a wafer for insertion into the load lock arrangement 12, or it has just opened and carried a finished wafer from load lock 12, which must then be unloaded from the vacuum chuck. The function of presenting a wafer to the door assembly 22 for loading, or for removing a processed wafer therefrom for unloading, is performed by cassette load/unload assembly 24, which includes wafer elevator assembly 68 and wafer cassette conveyor assembly 69. Extending below and on either side of chamber entrance 23 and attached to wall 32 of the chamber is the conveyor assembly, which moves cassettes 70 of wafers generally along from the right of the entrance as shown in FIG. 1 to left. The cooperating wafer elevator assembly 68 lifts wafers individually from the cassettes conveyed by conveyor assembly 69 to the operative end of vacuum chuck 60 within the inside face 64 of door assembly 22, or lowers such wafers from the door upon completion of processing.

Conveyor assembly 69 includes a spaced pair of parallel rails 72 and 73 extending horizontally and longitudinally across the front of wafer processing chamber 10. The rails support and convey cassettes 70, and the spacing of rails 72 and 73 is such that the sidewalls of the cassettes straddle the rail and enable the cassettes to be slidably moved along the rails across the conveyor assembly. Motive power for the movement of the cassettes is provided by chain drive means 75 which includes various guides and gear arrangements causing a roller chain to be moved alongside rail 72. The chain is provided at regular intervals with guide pins 76, which engage a matching cutout on the bottom of cassette wall 77 adjacent rail 72. Thus, the cassette is caused to move at the same rate as the chain toward and away from elevator assembly 68, as required. A stepper motor means 80 is provided as the driving power for the chain means 75, to provide precise control over the movement of the cassettes, so that any chosen individual wafer within a cassette may be positioned for interaction with the wafer elevator assembly 68. A conventional memory means is coupled to stepper motor 80 and wafer elevator assembly 68, which stores the location of an individual wafer within a cassette. Thus, although several further wafers may have been loaded into processing chamber 10 and the cassette accordingly advanced several positions since a first wafer was loaded, yet upon emergence of the completed first wafer, the stepper motor may be reversed the required number of steps to return the completed wafer to its original position, then again resume its advanced position to continue its loading function.

The cassettes 70 hold a plurality of the wafers 15 in spaced, facing, aligned and parallel relationship, and are open at the top as well as over a substantial portion of their bottom, to permit access from below and above the wafers. They must be loaded so that the front faces of the wafers, which contain the grooves, steps, and other features defining the microcircuit components, face away from the inside face 64 of the open door 22, and so that the rear faces of the wafers face toward the door assembly. This ensures that when the vacuum chuck 60 engages the wafer, no contact is made with the front face containing the delicate microcircuits, and that the wafer is properly positioned upon insertion into the load lock 12 so that it will be oriented properly with respect to processing equipment within the processing chamber 10.

The wafer elevator assembly 68 is positioned below and just to the left side of chamber entrance 23 and includes an upper guide plate 82, a blade-like elevator member 83, and an actuating cylinder 84 connecting to the lower end of member 83. Elevator blade member 83 is guided for movement up and down in a vertical path intersecting at right angles conveyor 69 between rails 72 and 73 to inside face 64 of door 22. Guide slot 85 in guide plate 82 just below the inside face of the door in the open position provides the uppermost guide for blade 83, while a vertical guide member 86 extending below the conveyor toward the actuating cylinder also aids in retaining blade 83 on its vertical path. The width of blade 83 is less than that of the spacing between rails 72 and 73, and also less than the spacing between the main walls of the cassettes 70 which straddle rails 72 and 73. Blade 83 is also thinner than the spacing between adjacent wafers retained in cassettes 70.

Blade member 83 is further provided with an arcuate upper end 87 shaped to match the curvature of the wafers, and a groove within this end adapted to match the thickness of a wafer and retain a wafer edgewise therewithin. Thus, elevator blade member 83 passes between guide rails 72 and 73 and intersects conveyor and cassette at right angles thereto, upon stepper motor means 80 and chain drive 75 bringing a cassette and wafer into registration over the path of the blade. As may be seen, the cassettes are constructed to allow access from below to the wafers, and to allow elevator blade 83 to pass completely therethrough. Accordingly, upon stepper motor means 80 and chain means 75 placing a cassette and wafer in registration over the path of the blade, blade 83 moves upwardly between the conveyor rails to engage from below a wafer within the groove of its upper end 87, and elevate the wafer upwardly to a position in registration concentrically with and immediately adjacent inside face 64 of chamber door 22 in its open position. Note that since the wafers are vertically oriented, gravity aids in holding the wafers firmly yet gently and securely in the grooved end 87 of the blade. Contact with the delicate front face of the wafer, upon which the delicate microcircuits are defined, is therefore virtually completely avoided, unlike the case of typical automated handling when the wafer is in a horizontal orientation. Thus the risk of damage or abrasion to the wafer is greatly lessened.

Upon arrival of the wafer at the door 22, vacuum chuck 60 engages wafer 15 at its rear face by suction, and elevator blade 83 then is lowered through guide slot 85 and the cassette to a point below conveyor 69. Door 22 then closes with the wafer retained by the chuck 60, and the wafer is thereby loaded into the load lock arrangement 12 and chamber entrance 23 sealed simultaneously as described above for processing within chamber 10. Prior to completion of processing for wafer 15, still further wafers may be loaded within the remaining ones of apertures 37 of plate assembly 18; therefore the stepper motor and chain drive step the cassette one wafer position to move the next wafer serially in position over blade 83. Blade 83 then rises to repeat its operation of moving this next wafer upwardly to the open door, whose vacuum chuck then again engages that wafer for insertion into the load lock. Meanwhile, upon completion of processing for original wafer 15 by rotation in turn to each station, it is again at load lock 12, and vacuum chuck 60 again extends to the backside of the wafer while the door is still in its closed position, and clip actuating means 62 simultaneously depress the clips to disengage same from the wafer to enable the removal thereof by chuck 60, whereupon the door is opened and the wafer again positioned over the path of blade 83. Meanwhile, stepper motor means 80 and chain means 75 move the cassette back so that the original position of wafer 15 is presented over the blade path. Blade 83 then rises through conveyor rails 72 and 73 and slot 85 upwardly to engage the lower edge of wafer 15, whereupon chuck 60 releases the wafer, and enables blade 83 to lower the wafer back into its original position within the cassette. The cassette is then propelled forward to the position of the next wafer to be processed serially.

Prior to the elevation of the individual wafers by the elevator assembly 69 and loading into the load lock, it is desirable to insure a standard orientation for the wafers, so that the usual guide flat 91 across a cord of each wafer is aligned to be lowermost in the cassettes. In this manner, each of the wafers is assured of assuming the same position with respect to the processing equipment within the chamber. Further, making certain that the guide flat is in a given predetermined position assures that clip assemblies 20 within plate assembly 42 will function properly, and not accidently engage a flat of the wafer instead of a portion of the main circular edge. To ensure such standard orientation, a pair of opposed rollers 90 is provided which are longitudinally extended along and between rails 72 and 73 so that the roller axes are parallel with the rails. The rails are positioned in the path of the cassettes just prior to the position of the elevator assembly 68, so that orientation of the wafers is completed prior to their reaching the elevator assembly. Upon passage of the cassette over the rollers, the rollers are elevated and then are driven serially and in opposed senses, one clockwise and the other counterclockwise, and lightly contact the circular edge of the wafers. Contact with moving rollers 90 then has the effect of rotating the wafers within the cassettes until the guide flat 91 of each wafer is positioned at a tangent to the moving rollers, whereupon contact with the roller is lost and the wafers are all positioned with guide flats facing downwardly and in alignment, whereupon the rollers 90 are retracted downwardly.

As aforementioned, pressure plate 16 is driven agains carrier plate 42 and wall 32 whenever door 22 is in its opened position, to protect the evacuated interior environment of the chamber from the atmosphere. We have seen that FIGS. 4 and 5 show in more detail the relative positioning of the pressure plate and wafer carrier plate, with FIG. 4 showing the aforementioned sandwich arrangement of the elements defining the load lock arrangement 12, and FIG. 5 showing the relative positioning of the elements when the pressure plate is in its withdrawn position. Note also that FIG. 4 shows vacuum chuck 60 in its extended position as the wafer is inserted into clip assemblies 20 with pins 66 of clip actuating means 62 partially extended after having spread the clips; while in FIG. 5, the vacuum chuck has withdrawn, as have the pins of the clip actuating means, and the wafer is now securely mounted in wafer carrier plate assembly 18. With pressure plate 16 withdrawn, the wafer is now ready to be rotated to subsequent processing stations. In FIG. 6, the vacuum chuck is also in the withdrawn position; however, the vacuum suction is operative, and the wafer is shown in its position against the inner face 64 of chamber door 22. This is, of course, the position of the elements of the load lock and the wafer just after the wafer has been withdrawn from clip assemblies 20, prior to its being removed from the load lock; or, it also represents the position of the elements just after the door has been closed and the vacuum chuck has not yet advanced the wafer to its position within aperture 37 of the wafer carrier assembly. Pins 66 of the clip actuating means 62 are shown bearing upon the clips just prior to depressing same to spread the clips in order to accept the wafer therewithin.

Upon completion of loading of the load lock with a wafer 15, the load lock is rough-pumped during a cycle lasting much less than a minute down to a level which, though still a good degree less evacuated than the chamber, does not appreciably disturb the chamber environment when the pressure plate is withdrawn as shown in FIG. 5, and the wafer 15 rotated to the next work station. This may be effectively done in such a short time frame not only because the load lock is of such small volume compared to the chamber (being only essentially that required to contain the wafer itself), but also because the outgassing load which was introduced therein is essentially only that of the wafer surfaces themselves, since no ancillary support equipment is utilized from sources outside of the load lock region, and since in any event the area of the clip assemblies supporting the wafer within the chamber is small relative to the wafer. This should be contrasted with the situation of prior art systems in which platens and other outside supports are introduced into the load lock, which supports have considerable area which contributes very greatly to the gas pumpdown load. Of course, the lack of such supports introduced from the outside also contributes significantly to a lessened risk of contamination. It should also be noted that the situation gets even better as the wafer advances to the subsequent work stations, since that portion of the pressure plate at the load lock region which is exposed to atmosphere (or the loading environment, which preferably is enclosed in a dry nitrogen environment) does not rotate with the wafer, but rather remains in the same loading station location, away from the remaining work stations and moreover is sealed off from the chamber environment during deposition.

While a wafer is being loaded into and/or unloaded from load lock station 12, pressure plate 16 is in its active advanced position of FIG. 4, whereby plate assembly 18 is forced against front wall 32 of the chamber, the pressure plate is similarly urging wafers in the remaining stations into contact or closer, working cooperation with the processing devices at those stations having processing devices on front wall 32. For example, at wafer heating station 28, the next station beyond load lock station 12, wafer heating means 92 for promoting wafer outgassing is provided. The wafer heating means 92, which is shown in FIG. 7, comprises a cylindrical supporting member 93 of somewhat lesser diameter than the wafers and includes as the heating element 94 a ceramic disc in which resistance wire is imbedded in a manner to allow the surface of the ceramic disc to be heated controllably and to a generally uniform temperature over its planar surface. The wafer heating means 92 is mounted upon front wall 32 of the processing chamber in a sealed aperture thereof, such that the heated surface of the element protrudes from the plane of the chamber front wall 32 to a slight degree. When pressure plate 16 is in its relaxed state, the location of the pressure plate with respect to the front wall of the chamber is spaced sufficiently so that the heated surface is not very close to the carrier plate or any wafer therewithin. However, when pressure plate 16 is in its active forward position, the wafer carrier plate 42 is compressed against front wall 32 of the chamber so that the spacing between the heated surface and any wafer in registration with the heating station is very close, but not so close so as to contact the heated surface, as may be seen from FIG. 7.

In a vacuum environment, the principal mechanism of heat transfer is by radiation. P-doped silicon wafers, which are widely used in semiconductor device fabrication, are quite transparent to infrared radiation. As a result, the rates of wafer temperature rise are too low to be effective in promoting increased wafer outgassing rates during the short outgassing cycle required in the apparatus of this invention. Because the wafers are stationary while at the wafer heating station 28, it is convenient to increase the rate of transfer of heat from the heating element 94 to wafer 15 by utilizing gas conduction heat transfer. This is accomplished by introducing through the central pipe 114 as shown in FIG. 7 some fraction of the argon gas employed for operation of the sputter deposition source directly into the space between heating element 94 and wafer 15. Heat transfer is effected as a result of argon atoms striking hot and cold surfaces alternately. To achieve desirably high rates of heat transfer, it is necessary to introduce the argon into heating station 28 at pressures which are in the range approximately 100 to 1000 microns, which are one to two orders of magnitude greater than the normal argon pressure in the main chamber of about 10 microns.

Wafer heating member 92 comprises also a backing plate 98 to which cylindrical support member 93 is attached. A vacuum seal between backing plate 98 and chamber wall 32 is provided by O-ring 115 To avoid degradation of the vacuum sealing properties of O-ring 115 by overheating as a result of heat generated in heating element 94, conduits 96 and 97 passing into and through backing plate 98 are provided to allow coolant to be flowed into and out of the backing plate, thereby cooling backing plate 98 to maintain the vacuum integrity of O-ring seal 115.

In certain applications, it will be desirable to heat and clean the wafers at the heating station by means of rf (radio frequency) sputter etch using methods which are well known to those skilled in the art. In order to perform the rf sputter etch operation in the short cycle time required in the apparatus of this invention, the required application of rf power may cause the wafer temperature to rise to an undesirable or unacceptable level. This problem may be alleviated through the use of gas conduction heat transfer once again, this time to transfer heat from the wafer to a cooled heat sink.

A suitable wafer cooling means 118, which is shown in FIG. 8, comprises a cylindrical heat sink member 119 mounted on a backing plate 120. A vacuum seal between backing plate 120 and chamber wall 32 is provided by O-ring seal 121 To maintain the temperature of heat sink 119 at a suitably low value, conduits 128 and 129 passing through backing plate 120 and into and through heat sink 119 are provided to allow coolant to be flowed into and out of heat sink 119, thereby maintaining its temperature at the desired level. Heat sink member 119 has a planar surface 125 closely spaced to but not in contact with wafer 15 when pressure plate 16 is in its active forward position. A central pipe 126 as shown in FIG. 8 is provided to allow some fraction of the argon gas employed for operation of the sputter deposition source to be introduced directly into the space between heat sink 119 and wafer 15. Such introduction of argon gas increases the rate of cooling by increasing the rate of heat transfer from wafer 15 to heat sink 119, in the same manner that the rate of heat transfer was increased from heating element 94 to wafer 15 in the case of heating station 28, as described earlier in connection with FIG. 7.

The next station to which the wafer is advanced is coating station 14, which is mounted on the back plate 99 of the chamber, and for which an aperture 101 of circular form is made within the pressure plate, to enable the sputtering source to direct coating therethrough to a wafer advanced by carrier plate assembly 18 into registration at the coating station. A shutter 102 is also provided to enable the coating material to be blocked during rotation of the carrier plate assembly and when a wafer is not present at the coating station. FIG. 9 shows the relationship of the elements at the coating station 14 in more detail. It might be noted that the geometry of FIG. 9 depicts the elements in their configuration just prior to movement by the pressure plate to its active forward position, to compress the wafer carrier plate against front wall 32 of the chamber. Thus the position of the wafer during coating will be closer to the front wall than illustrated in the rest position of FIG. 9, such that wafer 15 will be held in stable and stationary fixed concentric relationship with sputter source 100.

A major advantage of the manner of supporting the wafer edgewise and individually coating same is now clear. It is well known that the sputtering process whereby a metallization coating is deposited onto the front side of the wafer will cause the wafer to further be heated, and thus increase outgassing of the wafer at the worst possible time. However, the close coupling between the source 100 and wafer 15 with the consequently rapid coating deposition rate (approximately 10,000 angstroms per minute); the low level of contaminants (due, for example, to the lack of external wafer supports and the lack of any adjacent wafers adding outgassing products to the environment immediately ahead of the front face of the wafer); and the fact that the back-side outgassing products will most likely impinge on the shield structures surrounding the sputtering source; all contribute to a much lower concentration of contaminants due to outgassing ending up on the front surface of the wafer, compared to prior configurations. In the case of earlier batch and other load lock systems, a plurality of wafers are adjacent each other, will likely be supported upon a platen, and will not have the benefit of a source-to-wafer geometry to allow for individual shields upon which contamination products and coating material could preferentially combine rather than on the wafer surface itself, as in the present configuration.

Still other advantages grow out of the fact that the metallization of the individual wafer is carried out with the wafer in a vertical orientation, and further, that the metallization is done while the wafer is stationary. It is clear that if any debris or particulate matter is present in the system, the chances of such matter coming to rest on a vertical wafer surface are much reduced as compared to a case wherein the wafer is horizontally oriented. The fact that all motion within the chamber ceases during metallization means that no mechanical motion, shock, or vibration is present which would tend to promote debris generation, as, for example, by dislodgement of stray metallization material from wafer support structures, shields and other such surfaces. Additionally, in the present system, the stress on any such stray coating build-up on shields, and other internal chamber structure is further alleviated by lack of repeated exposure to air, a lessening of mechanical strains due to the necessity for stopping movement during the processing period, and fewer moving parts. The very small structure of clip assemblies 20 which support the wafer is not even itself exposed to air during normal operations, since the load lock is normally operated in a dry nitrogen environment, rather than moisture-bearing air.

The close-coupled wafer-source relationship, and its stationary aspect, have additional favorable implications for the desirable characteristics and homogeneity of the films deposited. The local rate of deposition at a point on the wafer surface depends on the radial position and surface topography, i.e., whether the surface at that position is planar, or the sidewall or bottom of a step or groove, or the inward or outward orientation of the sidewall, as will be discussed further below. Because the wafer is stationary with respect to the source, deposition at each point proceeds at a constant rate, rather than at a time-varying rate throughout the deposition (assuming constant power applied to the deposition source.) Thus, deposition thickness at various points and topographies will be radially symmetric about the axis common to the concentrically located deposition source and wafer.

Further, as implied above, contamination levels incorporated into the coating depend on the relative arrival rates at the wafer surface of molecules of contaminant background gases (such as oxygen) and atoms of the sputtered coating material (such as aluminum). If the partial pressures of contaminant background gases remain constant during constant-rate deposition, then the local contaminant level incorporated into the coating will be homogenous throughout the thickness of the deposited film.

By contrast, this situation has not obtained in prior art load lock systems in which wafer motion relative to the source leads to deposition rates which vary with time during the deposition period. This then leads to inhomogeneities in contaminant level incorporated into the coating during film growth, which in turn has adversely affected the yields of good semiconductor devices from the wafer. In the case of prior art systems in which wafers make multiple passes past the deposition source, the metal film is deposited in layered fashion, which in turn leads to an undesirable layered contaminant level profile.

Figure 10:
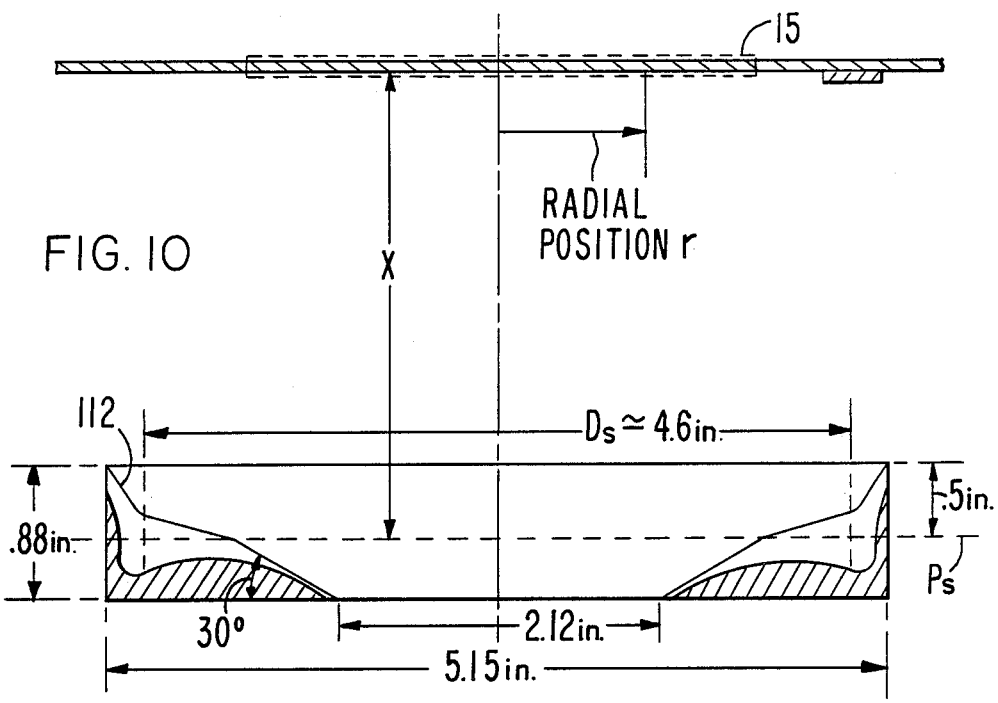
FIG. 10 is a schematic cross-sectional view focusing on the wafer and sputtering source target of FIG. 9, which shows the spatial relationships, relative positioning, and dimensions of these elements in greater detail.

Reverting now to a more detailed consideration of sputtering source 100 of FIG. 9, we see that the emitting end thereof includes a ring-shaped target 112, which is shown schematically in dotted representation in FIG. 9, but which is shown in greater detail in cross-section in the schematized cross-section of FIG. 10. An example of such a sputtering source may be found described in more detail in U.S. Pat. No. 4,100,055, issued July 11, 1978 to R. M. Rainey for "Target Profile for Sputtering Appparatus". Such a sputtering source is also commercially available from and manufactured by Varian Associates, Inc. under the registered trademark "S-Gun". Such sputter coating sources employ a magnetically confined gas discharge and require a subatmospheric inert gas environment as of argon. Other sputtering sources with ring-shaped targets may also be used, as, for example, a planar magnetron source.

Positive ions from the gas discharge strike S-Gun target 112, which is made of the source material for coating which is desired to be deposited, for example, aluminum. Thus, source material is caused to be sputtered from the target outwardly from the source. The sputter coating process is carried out in the subatmospheric controlled environment of vacuum chamber 10, within which the dominant gas is normally argon, deliberately introduced at very low pressures to sustain the gas discharge. The argon pressure required to sustain the discharge is generally in the range 2–20 microns, and . has been found to influence coating quality, as will be further described below. It is found that the argon needed for such discharge sustenance may advantageously come from the argon deliberately introduced at the various wafer processing stations, as described above in connection with wafer heating station 28 and wafer cooling means 118.

As may be seen from FIGS. 9 and 10, source 100 may be regarded as a ring-shaped source with an inner diameter and an outer diameter, and with a profile connecting the two diameters of generally inverted conical configuration averaging about 30 degrees. It will be noted that the term "conical" is an approximation, since in practice the profile of target 112 will erode significantly over the life of the target. FIG. 10 illustrates in superimposed fashion both a typical new target profile, and that same target's profile at the end of target life. Moreover, many profile variations are possible; see, for example, the above mentioned U.S. Pat. No. 4,100,055; further, some useful ring sources, for example, of the planar magnetron type, will not exhibit this generally conical profile.

Despite such erosion, a significant fraction of the material emanating from target 112 is still directed inwardly toward the axis of the source, even when near the end of target life. In addition, some material from the more eroded .bottom sections of the target which may be directed outwardly will actually be intercepted by the eroded sides, from which resputtering in a generally inwardly direction may occur. Thus, even with target erosion, the source 100 may be characterized as acting as a ring-shaped source, and of effectively generally inverted conical configuration. It is believed that the generally inverted conical configuration leads to a greater efficiency of utilization of material sputtered from the source than for a planar configuration. This is believed to be so because a larger fraction of the sputtered material is directed generally inwardly because of the conical configuration, resulting in a larger fraction being deposited on the wafer instead of being deposited uselessly on the shielding.

As may be seen from FIG. 9, the wafer 15 is held in fixed concentric stationary and parallel relationship with respect to source 100 during coating as described above, being supported resiliently within the relatively thin wafer carrier or transfer plate assembly 18 by clip assemblies 20. These relationships are more analytically treated in the schematic showing of FIG. 10, which serves to help define the effective source target-to-wafer spacing x, the effective source diameter $D_s$, and the radial position r along the wafer to be coated measured from the center thereof. In defining these quantities, it is useful to identify an effective plane of the source $P_s$, which is the planar level such that by the end of target life, the amounts of material eroded above and below this planar level are equal. It is also useful to define the effective source diameter $D_s$ as that diameter such that by the end of target life, the amount of material eroded outside of that diameter is equal to the amount of material eroded away inside that diameter. Accordingly, x is analytically the distance between the wafer and the plane $P_s$. A typical sputtering source 100 such as is commercially available can have actual outer and inner target diameters of 5.15 inches and 2.12 inches respectively, and a target height of 0.88 inches, as shown in FIG. 10. Thus, for the erosion pattern shown, the effective source diameter $D_s$ is approximately 4.6 inches for such a commercial source. Likewise, it can be seen that the effective plane $P_s$ of the source is located approximately 0.5 inches below the top edge of the uneroded target.

It has been found that, surprisingly, coating of the semiconductor wafers with very good planar uniformity and superior step coverage is possible while maintaining wafer 15 stationary as shown with respect to source 100 during deposition, and that this may be done within relatively short deposition times of approximately one minute, as long as certain geometrical and positional constraints are observed, and a proper inert gas environment and pressure are maintained. These preconditions for obtaining very good uniformity and superior step coverage, as well as the degree of improvement in these factors which may be expected, are illustrated graphically in FIGS. 11 through 15. It should be understood that the term "uniformity" as utilized herein and in the Figures is the ratio of thickness at the radial position at which the uniformity is being considered to the thickness at the center of the wafer. Thus, as usual, uniformity is normalized to unity at the center of the wafer.

Figure 11:
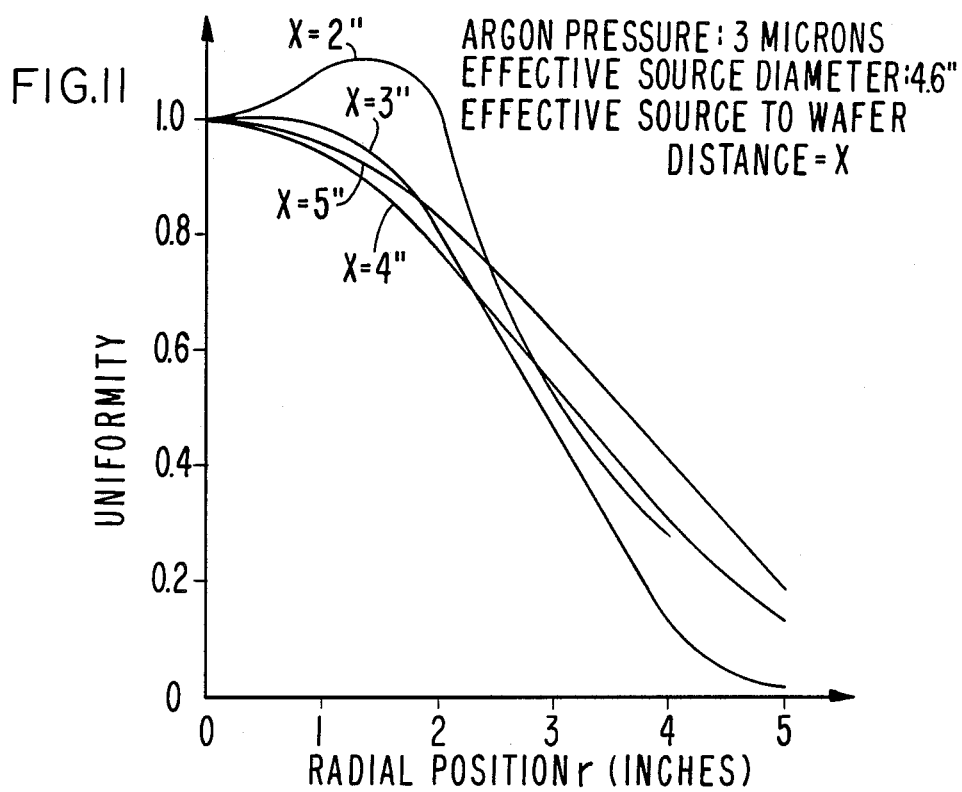
FIG. 11 is a graph illustrating the uniformity of thickness of deposition on the main planar surface of the wafer by the source of FIGS. 9 and 10 as a function of the radial position on the wafer, for each of several wafer-to-source distances.
Figure 12:
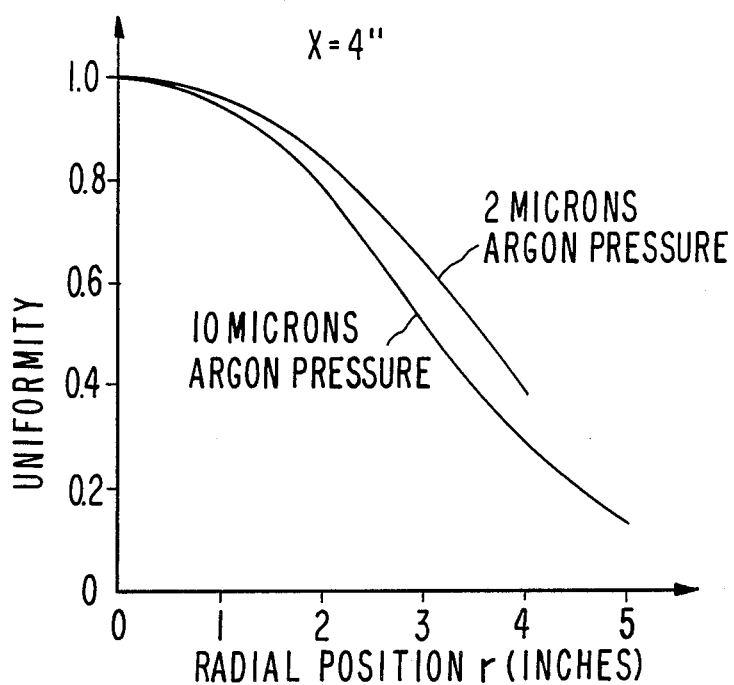
FIG. 12 is a plot similar to FIG. 11, but for only a single wafer-to-source distance, one curve being for a deposition environment of 2 microns argon pressure and the other being for a deposition environment of 10 microns argon pressure.

FIGS. 11 and 12 illustrate uniformity of thickness of deposition on the main uppermost planar surfaces of wafer 15 as a function of radial position r in inches, with uniformity being a relative measure, normalized as aforementioned. In FIG. 11, four curves are shown, each being associated respectively with source-to-wafer distances x of 2, 3, 4 and 5 inches. The argon environment of the chamber is at a pressure of 3 microns. In FIG. 12, both uniformity curves are for source-to-wafer distance x equal 4 inches; however, one is for an argon environment of 2 microns pressure, while the other is for an argon environment of 10 microns pressure.

FIG. 11 illustrates the surprising result that uniformity of deposition over the planar surface of wafer 15 is very good, even with no relative motion between source and wafer, as long as the effective source diameter $D_s$ is greater than the diameter $D_w$ of the wafer. More specifically, as shown by FIG. 11, the uniformity of planar coverage is better than ±15% as long as: (a) x is approximately within the range 0.4 $D_s$ to 1.1 $D_s$ (x=2-5" for $D_s$=4.6"); and (b) the maximum wafer diameter $D_{wmax}$ is less than approximately 0.9 $D_s$, (or a value of r, equal to ½ the wafer diameter, of approximately 2.1" for a source of $D_s$=4.6" effective diameter).

Even better tolerances are exhibited over certain ranges of wafer diameters within the above outside limits. For example, over the range of ratios of wafer diameter-to-source diameter up to about 0.65 (or at radial positions r up to about 1.5"), uniformity is better than ±8%. In other words, over a wafer diameter of 3.0", and with a source effective diameter of 4.6", and assuming 3 micron argon pressure environment, the planar uniformity is better than ±8%, regardless of which source-to-wafer spacing x is chosen within the range 0.4 $D_s$ to 1.1 $D_s$. By restricting the source-to-wafer spacing x to the range approximately 0.4 $D_s$ to 0.9 $D_s$ (x=2-4" for $D_s$=4.6"), the planar uniformity is further improved to better than ±5%, as may be seen from FIG. 11.

The foregoing planar uniformity figures will be influenced by the argon pressure of the environment within which the deposition is carried out, but the above surprising uniformity results hold nonetheless. Considering the influence of the pressure factor more particularly, FIG. 12 shows what occurs for the exemplary case of source-to-wafer distance of x=4" and a 5" outer-diameter source (for which the effective source diameter $D_s$=4.6") under two conditions: a 2-micron pressure argon environment, and a 10-micron pressure argon environment. We see that at an argon pressure of 2 microns, a uniformity of ±10% is obtained out to a maximum wafer diameter of approximately 4.3" (radial position r of approximately 2.2"). Upon raising the argon pressure to 10 microns, the maximum diameter to maintain the same uniformity of ±10% is reduced by about 16% to approximately 3.6" (radial position of approximately 1.8"). Alternatively, it can be seen that for a wafer of 3.0" diameter, the uniformity is about ±4% for an argon pressure of 2 microns, and becomes approximately ±7% for an argon pressure of 10 microns, both of which are superior results for many semiconductor wafer applications.

Figure 15:
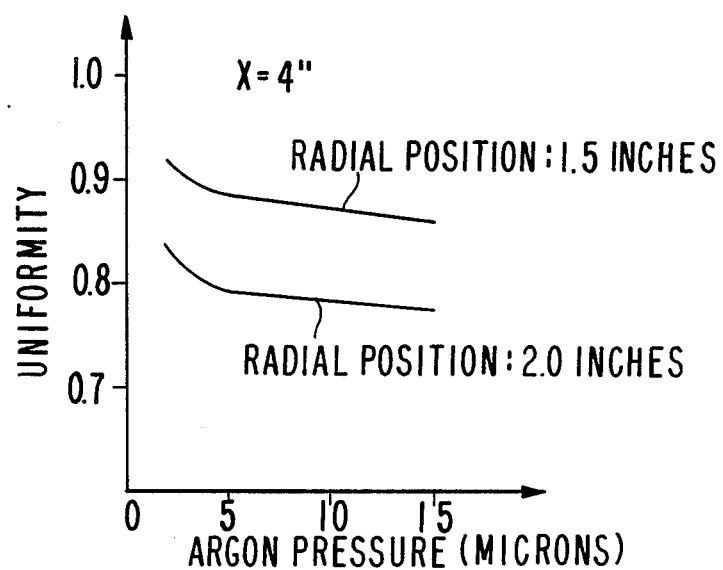
FIG. 15 is a plot of uniformity of planar coverage as a function of argon pressure of the coating environment, one curve being for the radial position 1.5 inches, and the other being for the radial position 2.0 inches.

FIG. 15 is a further showing of the influence of the pressure of the argon environment. In this Figure, for a source-to-wafer spacing of 4", uniformity of planar coverage is shown as a function of microns of argon pressure for two radial positions, one at 1.5", and the other at 2.0". As expected, the innermost radial position will exhibit the highest uniformity, but both vary in similar fashion over the range of argon pressures. It will be seen that from 0 to 5 microns, the change is most rapid at both radial positions. However, from about 5 to 15 microns, uniformity changes very little, on the order of a few percent in both cases. Thus, it may be seen that the planar uniformity is not very sensitive to changes in argon pressure within the range 5 to 15 microns, a surprising fact which becomes important in optimizing step coverage, which is much more affected by changes in argon pressure, as will be explained in more detail below.

In order to obtain a fully satisfactory coating, it is essential that the sidewalls of such features as grooves and steps within the main planar surface of wafer 15 be adequately coated, i.e., that good "step coverage" be provided. Sidewalls may be defined as those surfaces generally perpendicular to the main planar surface of the wafer. Step coverage is difficult both to specify and to measure. Scanning electron microscopes are used by semiconductor device manufacturers as a principal tool for assessing at least subjectively the adequacy of step coverage achieved in particular applications.

In the prior art, extensive experience taught the need for relative motion of the wafers with respect to the deposition source to obtain adequate uniformity and step coverage, as we have seen. A recent article by I. A. Blech, D. B. Fraser, and S. E. Haszko, "Optimization of Al step coverage through computer simulation and electron microscopy", *J. Vac. Sci. Technol.* 15, 13–19 (January–February 1978), reports excellent agreement between computer simulations of metal film deposition and scanning electron microscope (SEM) photographs of actual film step coverage obtained with an electron beam evaporator source plus planetary fixture configuration, with deposition onto unheated substrates. Although the source employed in the references is a small-area thermal evaporation source, while in the apparatus of the present invention, a ring-shaped sputter source 100 is employed, and further the instant source is stationary and close-coupled, the geometrical considerations examined in the reference are quite indicative. Although, the deposition on various surfaces by a source as in the present invention should be much better than from a centrally-located source of small area as in the reference, the considerations examined in the reference nevertheless indicate that for wafer sizes of practical interest relative to the diameter of the ring source, enough shadowing would occur to place the possibility of adequate step coverage over much of the wafer in serious doubt. Surprisingly, however, in the present invention, very high quality step coverage is, in fact, achieved. Although many of the configurations above described in connection with FIGS. 11 and 12 which result in very good uniformity of planar coverage also afford good step coverage, certain ranges and values of source-to-wafer spacing and wafer-to-source diameter relationships have been identified which provide still better quality in such coverage as have certain ranges and values of argon pressure for the coating environment.

Figure 13:
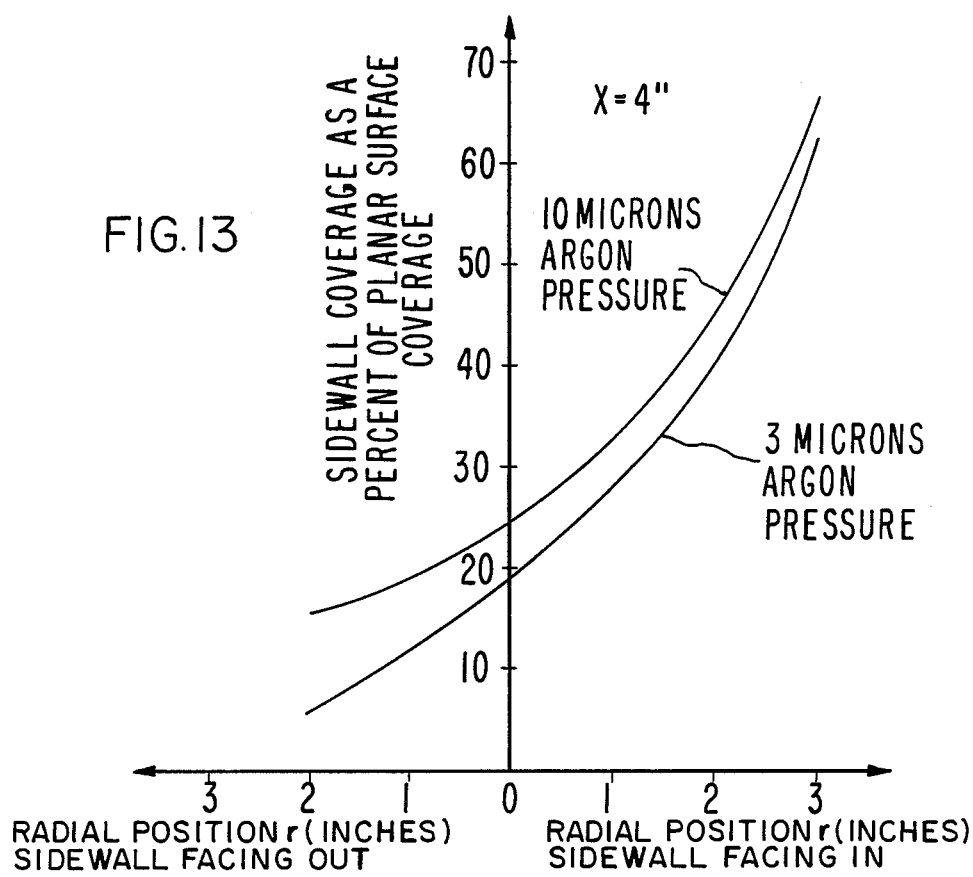
FIG. 13 plots thickness of coating coverage on the sidewall of grooves within the wafer surface as a function of the radial position on the wafer, both for outwardly-facing (relative to the center of the wafer) sidewalls, as well as inwardly facing sidewalls, for a source-to-wafer distance of 4 inches, one curve being taken at 10 microns argon pressure, and the other at 3 microns argon pressure.
Figure 14:
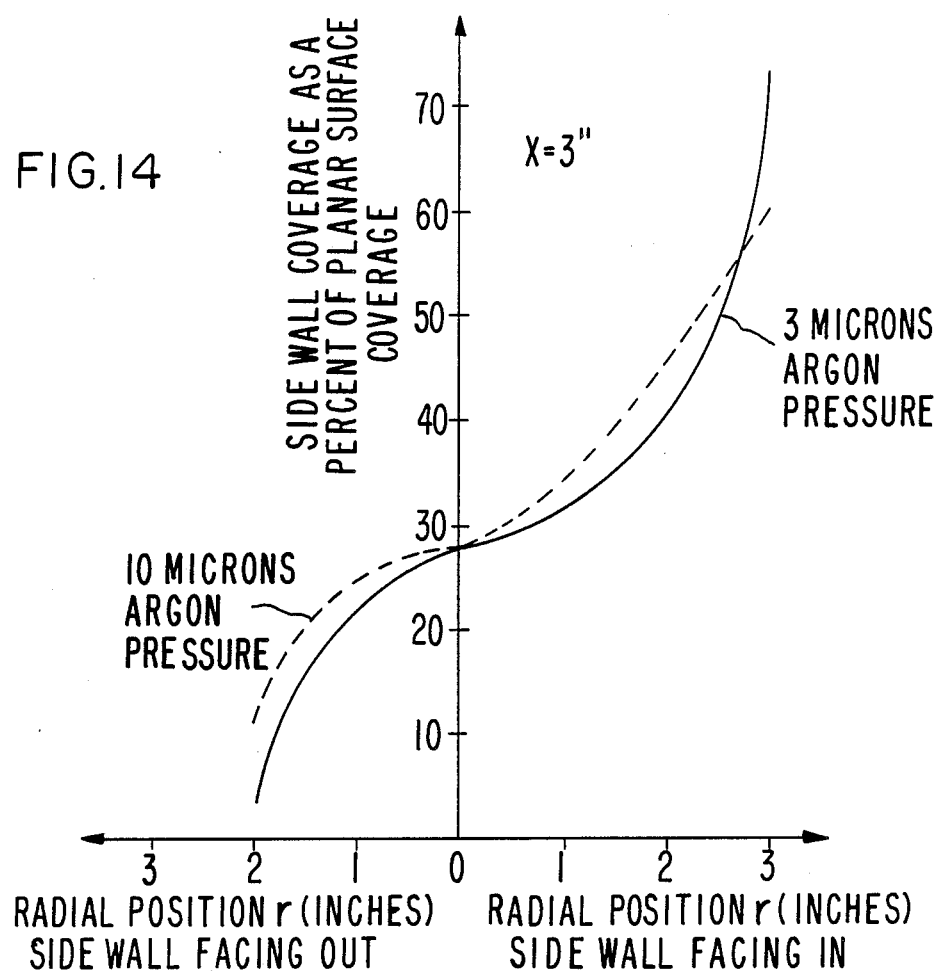
FIG. 14 is a plot similar to FIG. 13, except that the source-to-wafer distance is 3 inches.

FIGS. 13 and 14 aid in defining these optimal parameters, and plot the measurements of thickness of sidewall coverage as a function of radial position r. All data at each radial position are normalized to the thickness of deposition which will be obtained on the planar surface at that radial position. Note that the horizontal axis of each graph shows values extending to both sides of the vertical axis. This is because, physically, a given groove defined in the wafer may have sidewalls which face both toward the center of the wafer and away from the center of the wafer. Not surprisingly, the outwardly-facing side generally receives a significantly thinner deposit than the side facing in, despite both being generally in the same radial position. This fact is reflected in FIGS. 13 and 14, so that the left side of the horizontal axis corresponds to radial positions for sidewalls which face outwardly, while the right side corresponds to radial positions for sidewalls facing inwardly. It will further be noted that the vertical graph plots sidewall coverage as a percentage of the planar surface coverage, and is normalized as indicated above. Both graphs show a curve for 3 microns argon pressure and 10 microns argon pressure, with FIG. 13 being for a source-to-substrate distance x of 4", while that of FIG. 14 is for a source-to-substrate distance x of 3".

As is readily apparent from the curves, a further unexpected result is revealed in that the sidewall coverage on the more difficult to coat outwardly-facing wall is dramatically improved upon raising the pressure of the argon atmosphere from 3 microns to the 10 micron region. This is true for a range of source-to-wafer spacings, for example, in both the case of x=3 and x=4. In the FIG. 14 case (x=3"), sidewall coverage is increased, for example, from less than 4% to almost 12% at a radial position of 2.0" (corresponding to the edge of a 4" diameter wafer), and from 15% to 20% at the edge of a 3" diameter wafer. From FIG. 13 (x=4"), sidewall coverage is increased from approximately 9% to approximately 17% at the edge of a 3" wafer. Again, we see that the same general source-to-wafer distances and the same kinds of relationships between wafer and source which were found to give rise to good planar coverage also result in good sidewall coverage, particularly when some care is taken to consider the beneficial effect of increased argon pressure in improving coverage of the outwardly-inwardly facing sidewall, within a range which does not seriously degrade the uniformity of planar surface coverage.

Further, within these general parameters, more specific ranges are of great interest for the most improved sidewall coverage. More specifically, for source-to-wafer distances x of 0.4 $D_s$ to 0.9 $D_s$ (i.e., x=2–4", assuming an effective source diameter $D_s$=4.6"), and wafer diameters within approximately 0.7 $D_s$ (or up to $D_w$=3.2", assuming an effective source diameter $D_s$=4.6"), not only will planar deposition uniformity be better than ±10%, but also minimum sidewall coverage will be at least 10% of the planar coverage, or more, as long as the argon pressure is kept in the vicinity of 10 microns. Certain ranges within the foregoing are still more useful. For example, as we have seen from FIGS. 13 and 14, at a source-to-wafer distance of x=3", sidewall coverage is at least 20% of the planar coverage on out to the edge of a 3" wafer, while at x=4", sidewall coverage is at least 17% in the same situation.

An exemplary set of results can be tabulated from the above data for argon pressures during coating of 10 microns, and for source-to-substrate distances x in the range 0.4 $D_s$ to 0.9 $D_s$, as follows:

TABLE I

| Uniformity of planar surface coverage | Minimum sidewall coverage | Maximum diameter of semiconductor wafer or other substrates ($D_{wmax}$) |
|---|---|---|
| Better than ±20% | — | $D_{wmax}$ = 4.2" = 0.9 $D_s$ |
| Better than ±10% | Greater than 10% | $D_{wmax}$ = 3.2" = 0.7 $D_s$ |

Similar results are obtained for 4" and 5" diameter wafers. Thus, for example, for uniformity better than ±10%, and sidewall coverage greater than 10%, the minimum effective source diameters $D_s$ are approximately equal to 5.7" for 4" diameter wafers, and 7.1" for 5" diameter wafers. It is of course possible to coat 3" and 4" diameter wafer using sources designed for 5" diameter wafers. In sustained production, however, considerations of efficient utilization of source material may argue in favor of sources whose sizes are optimized to each wafer size.

It is believed that some of the observed improvements in sidewall coverage with increasing pressure of the argon environment arise as a result of collisions between the sputtered metal atoms and the atoms of argon gas located in the space between the source and the wafer. Sputtered atoms are thus "gas scattered" around corners and over edges into regions which are shadowed from line-of-sight deposition. SEM photographs do indeed show that the step coverages obtained using 10 microns argon pressure, for example, are significantly better than those obtained using an argon pressure of 3 microns.

It is further known (see for example, the paper by Blech, et al., referenced above) that step coverage can be improved by heating the substrates during aluminum deposition to temperatures on the order of 300° C. This beneficial result arises from the increased mobility at elevated temperatures of the aluminum atoms during film growth. With the close-coupled source used in the present apparatus, and the stationary source-to-wafer relationship during coating, high deposition rates are achieved, and at a rate of 10,000 angstroms per minute, for example, considerable heat is generated. For example, the heat of condensation of aluminum plus the kinetic energy of the sputtered atoms reaching the wafer surface is approximately 0.2 watts per square centimeter at the above deposition rate. The resulting temperature rise of a typical semiconductor wafer during a one-minute deposition cycle may be as much as 200° C. Thus, such elevation of wafer temperature during this close-coupled and stationary-configuration deposition within the present apparatus may help cause aluminum migration to occur to a degree which is beneficial to step coverage. Further, additional application of heat can improve step coverage even further. However, the possibility of closely controlled application of even heat to wafers to be coated in order to take full advantages of these possibilities has not heretofore been feasible. In prior art systems, the wafers are in uncertain thermal contact with the wafer support structure. Close coupling between wafer and source has been the exception, rather than the rule, and deposition rates for a single wafer have not been very high. Control over wafer temperatures during processing has left much to be desired.

By contrast, in the apparatus of the present invention, wafers are handled on an individual basis. In addition, wafers are held stationary while at the various processing stations and are closely coupled thereto (except for the load lock station). Further, since the wafers are supported edgewise, both sides of the wafers. are accessible for processing. As one consequence of these features, it has now been possible to provide means such as 92 to control wafer temperatures individually at each processing station. In particular, temperature control in the present invention is achieved as aforementioned by the gas conduction heat transfer means discussed above in connection with wafer heating station 28 and wafer cooling means 118 These means overcome the problems of heating or cooling the wafer in an evacuated environment by introducing some fraction of the argon gas (a certain amount of which is required in any event for operation of the sputter deposition source) in the space behind the back face of the wafer, as described above. Such wafer heating or cooling means may also be employed elsewhere, for example, at the coating station itself. It is known that not only step coverage, but also various film properties, such as reflectivity, resistivity, and contact resistance are affected by wafer temperatures during processing. To obtain, consistently and reproducibly, a particular set of desired film characteristics requires that the wafer temperatures be reproducibly controlled throughout the processing cycle Thus, the apparatus of the present invention provides means for obtaining, consistently and reproducibly, a particular set of desired film characteristics including step coverage through wafer temperature control throughout the processing cycle.

Referring once again to FIG. 1, the next station to which the wafer 15 is advanced is a second coating station 128. In some applications, two different metals are required to be deposited sequentially onto the wafer 15, the first metal being deposited at the first coating station 14, and the second metal being deposited at the second coating station 128. When only a single metal is employed, the second coating station 128 may be left inoperative. Alternatively, coating station 12 may be employed to double the amount of sputtering source material available, thereby doubling the time between replacement of the ring-shaped targets 112. Both coating stations may be operated simultaneously with, for example, each station operating at one-half the normal deposition rate. Alternatively, of course, one coating station may be operated alone until, for example, the end of target life is reached, whereupon the responsibility for deposition may be transferred to the other coating station.

The next station to which wafer 15 is advanced is the cooling station 130. If the wafer temperature is not too high when it reaches the cooling station, normal radiative heat transfer may suffice to lower the temperature of the wafer to the point that it can be safely removed from the vacuum environment by the end of the cooling cycle. If adequate cooling is not achieved by radiation alone, the problem may be alleviated by the use of the wafer cooling means 118 of FIG. 8, as discussed previously in connection with the cooling of wafers at the heating station during rf sputter etch. Once again, the use of gas conduction heat transfer, this time at cooling station 130, may play an important role in achieving the short cycle time required in the apparatus of this invention.

The final station to which wafer 15 is advanced is the load lock station 12, from which the wafer is removed and returned by means of load/unload assembly 24 to the same slot in the cassette 70 from which it originally came. The entire load/unload operation was described in detail earlier.

The preferred embodiment of the apparatus of this invention includes a plurality of processing stations for heating, coating, cooling and the like, and a wafer carrier plate assembly 18 for transporting wafers on an individual basis from station to station. There are many advantageous features inherent in the single wafer concept with the wafer close coupled and stationary with respect to the deposition source.

For certain applications, an alternative embodiment includes an apparatus in which the wafer or other substrate remains affixed to the load lock door during processing, the wafer carrier plate assembly being eliminated. A gate valve on the high vacuum side of the load lock provides communication between the wafer and the deposition source. A typical operation might include, for example, the steps of: wafer loading; wafer heating (or, alternatively, application of r.f. sputter etch); deposition from a sputtering source; wafer cooling; and wafer unloading. Gas conduction heat transfer could be advantageously employed to accelerate heating and cooling, and to provide control of wafer temperature during deposition. Although the apparatus of this embodiment lacks some of the versatility and high production rate capability of the preferred embodiment, it does have several appealing features, including: inherent simplicity and reliability; no wafer transport inside the vacuum system; and the wafer load at risk is at the irreducible minimum of one.

In the preferred embodiment of the apparatus of this invention, the wafer 15 is presented vertically to the inside face of chamber door 22, where it is engaged by vacuum chuck 60. Vacuum chuck 60 and clip actuating means 62 are mounted within chamber door 22. Chamber door 22 is the outer door of load lock arrangement 12.

In some applications it may be desirable to separate the wafer loading/unloading means from the vacuum sealing means. Accordingly, a further embodiment is one in which the wafer loading/unloading means retracts after loading the wafer into wafer carrier plate assembly 18, following which a separate O-ring-sealed door is brought into position to effect the outer seal for the load lock.

We claim:

1. Apparatus for serially processing generally circular wafers, comprising:
    vacuum chamber means provided with an entrance opening and a movable door for sealing said opening;
    vacuum pump means for evacuating said vacuum chamber means;
    transfer plate means vertically oriented within said chamber means and supported for rotation around a horizontally oriented axis, said transfer plate means having a plurality of apertures for accommodating individual ones of said generally circular wafers in a manner such that one face of a wafer is at least substantially fully accessible for processing from one side of said transfer plate means and the other face of said wafer is at least substantially fully accessible for processing from the other side of said transfer plate means, said apertures being positioned to face said entrance opening and successive processing station positions as said transfer plate is rotated from position to position;
    at least one sputtering source mounted in said chamber means, said at least one sputtering source being located at a particular one of said station positions and having a cathode for emitting coating material in a direction toward one side of said transfer plate means;
    wafer holding means at each aperture for holding a wafer vertically, said wafer holding means at each aperture being connected to said transfer plate means and adapted to contact a wafer at a said aperture in a plurality of locations adjacent the periphery of the wafer, and configured so that both faces of a wafer held by said holding means are fully exposed except for minor areas covered by said wafer holding means;
    pressure plate means mounted interiorly of said entrance opening and capable of axial movement with respect to said transfer plate means for sealing off the aperture which faces said entrance opening from said chamber means when said door is opened to load and unload wafers into and from said chamber means, whereby a load lock is defined; and
    means for intermittently rotating said transfer plate means so that a given one of said apertures progresses from station to station to first have a wafer loaded therein to thereafter be presented for processing at each process station in succession and thence to be unloaded from said transfer plate means at said load lock and,
    means for transporting a wafer to the wafer holding means at an aperture positioned opposite said entrance opening.

2. Apparatus as in claim 1 in which said wafer holding means at each aperture includes a plurality of clip means disposed generally in a circular pattern and in spaced apart relationship and adapted to contact a wafer held thereby in said plurality of locations adjacent the periphery of said wafer.

3. Apparatus as in claim 2 in which each of said clip means includes a resilient forward facing portion external to said wafer, and in which said door is further provided with a plurality of moveable clip depressing protrusions inwardly extendible when said door is closed to bear upon said forward facing clip portions, whereby said clip means are slightly spread apart upon insertion of said wafer to prevent abrasion thereof.

4. Apparatus as in claim 1 in which said door and said chamber entrance opening lie in vertical planes, said door is hinged to one side thereof and opens to a position approximately at right angles to its closed position, said door being further provided with moveable protrusions extendible to bear upon said wafer holding means to open same upon loading and unloading of a wafer to facilitate said loading and unloading.

5. Apparatus as in claim 4 in which said wafer holding means comprises a plurality of clips mounted at the periphery of each of said apertures and extending radially inwardly and externally of a wafer being held thereby.

6. Apparatus as in claim 1 in which said cathode has a circular outline and in which said wafer holding means is adapted to hold a wafer in concentric and parallel relationship to said cathode during coating, the diameter of said cathode is between 1.6 and 1.8 times the diameter of the said wafer,
    and said transfer plate means maintains said wafer at a spacing from said cathode during coating of from 0.3 to 0.7 times the diameter of said cathode, to optimize coating uniformity both over the main surface of the wafer and the surfaces of grooves defined within said main wafer surface.

7. Apparatus as in claim 1 in which said at least one sputtering source is spaced from said load lock, and wherein said wafer holding means at each aperture comprises clip means mounted within the plane of each said aperture and within the periphery of said aperture for holding a wafer peripherally and resiliently supporting said wafer within the plane of said aperture.

8. Apparatus as in claim 1 in which said transfer plate means comprises a rotatable flat plate having said plurality of apertures arranged at the same radial distance about said horizontally oriented axis, and spaced laterally equally from each other, said plate being parallel to the plane of said entrance opening and immediately adjacent thereto.

9. Apparatus in accordance with claim 1 wherein a fixture for thermal transfer by gas conduction is located at one of said successive processing station positions and wherein when said pressure plate means seals off said aperture which faces said entrance opening a wafer held by said wafer holding means at said aperture adjacent said fixture is positioned in close coupled contact with respect to said fixture to permit thermal transfer by gas conduction.

10. Apparatus as in claim 1 wherein said means for transporting comprises chuck means adapted to support a wafer, means for moving said chuck means so that a wafer supported thereon is moved through said entrance opening and into registry with said wafer holding means at one of said apertures when the aperture is positioned to face said entrance opening, and means for causing said chuck means to release a wafer to said wafer holding means.

11. Apparatus as in claim 10 in which said entrance opening and transfer plate means lie in generally vertical and parallel planes, and in which said means for transporting includes
   elevator means for raising a wafer from a cassette supporting a plurality of wafers to a position adjacent to and parallel with the inside surface of said door when in an open position,
   said chuck means being mounted within said door for engaging said wafer by vacuum suction.

12. Apparatus as in claim 11 in which said means for transporting also includes a conveyor means for moving said cassette across and below said entrance opening, said cassette retaining wafers in vertically facing and aligned spaced relationship, said elevator means being positioned below said conveyor means and including a blade member for engaging edgewise a wafer from below and propelling same upwardly to said chuck means.

13. Apparatus as in claim 12 in which said wafer holding means at each aperture comprises a plurality of clips for edgewise supporting a wafer, each clip including a generally inwardly extending flat portion portion facing said chamber entrance, and in which said door is further provided with a plurality of pins extendible against said flat portion of each of said clips upon closure of said door, whereby loading and unloading of said wafers into and from said wafer holding means is facilitated.

14. Apparatus as in claim 10 wherein said transport means is adapted to cooperate with a cassette containing a plurality of wafers held vertically and aligned side-by-side in spaced relationship,
   said chuck means being mounted within said door for engaging and supporting closely adjacent the inside surfaces of said door by vacuum suction a wafer brought adjacent said chuck means when said door is in an open position, said transport means including
   means for carrying a wafer from said cassette to a position adjacent said chuck means.

15. Apparatus as claimed in claim 10 further comprising
   cassette means outside said vacuum chamber means and configured to hold a plurality of wafers;
   transfer means adapted to remove wafers individually from said cassette means and position the wafers individually at an intermediate location outside said chamber means;
   said chuck means being adapted to grasp a wafer at said intermediate location; and
   said means for moving said chuck means being adapted to move said chuck means between said intermediate location and said entrance opening.

16. Apparatus as claimed in claim 15 further comprising means for controlling the temperature of a wafer, said temperature controlling means being positioned in said chamber means at one of said processing station positions and in spaced facing relation to said transfer plate means, and means for causing relative movement between said temperature controlling means and said wafer holding means, one toward the other, in a direction substantially parallel to the axis of rotation of said transfer plate means in order to place a wafer held by said wafer holding means in closer heat exchange relation with said temperature controlling means.

17. Apparatus as claimed in claim 10 further comprising means for controlling the temperature of a wafer, said temperature controlling means being positioned in said chamber means at one of said processing station positions and in spaced facing relation to said transfer plate means, and means for causing relative movement between said temperature controlling means and said wafer holding means, one toward the other, in a direction substantially parallel to the axis of rotation of said transfer plate means in order to place a wafer held by said wafer holding means in closer heat exchange relation with said temperature controlling means.

18. Apparatus as claimed in claim 10 wherein said wafer holding means is movable between an open position for receiving a wafer and a closed position for retaining a wafer; and
   said apparatus further comprising means for automatically actuating said wafer holding means to said open position, said actuating means being mounted on said chuck means, and means for causing relative movement between said chuck means and said actuating means.

19. Apparatus as claimed in claim 1 further comprising means for controlling the temperature of a wafer, said temperature controlling means being positioned in said chamber means at one of said processing station positions and in spaced facing relation to said transfer plate means, and means for causing relative movement between said temperature controlling means and said wafer holding means, one toward the other, in a direction substantially parallel to the axis of rotation of said transfer plate means in order to place a wafer held by said wafer holding means in closer heat exchange relation with said temperature controlling means.

20. Apparatus as claimed in claim 19 further comprising means for introducing heat conducting gas between said temperature controlling means and a wafer held in said wafer holding means when a wafer held in said wafer holding means is in said closer heat exchange relation with said temperature controlling means.

21. Apparatus as claimed in claim 19 wherein said wafer holding means is movable between an open position for receiving a wafer and a closed position for retaining a wafer; and
   said apparatus further comprising means for automatically actuating said wafer holding means to said open position, said actuating means being mounted on said chuck means, and means for causing relative movement between said chuck means and said actuating means.

22. Apparatus as claimed in any one of claims 1, 10, 15, 19, 17, 16, 20, 18 or 21 wherein said wafer holding means is adapted to support a wafer for resilient movement;
   said transfer plate means comprises sealing means in the form of a first continuous annular sealing surface;
   said pressure plate means has a second continuous annular sealing surface matching said first annular sealing surface; and
   said wafer holding means is positioned on said transfer plate means inwardly of said first annular sealing surface, whereby a wafer in said wafer holding means is supported for resilient movement relative to said first annular sealing surface.

* * * * *